United States Patent [19]
Tran et al.

[11] Patent Number: 5,715,276
[45] Date of Patent: Feb. 3, 1998

[54] SYMBOL-MATCHED FILTER HAVING A LOW SILICON AND POWER REQUIREMENT

[75] Inventors: Jimmy Cuong Tran, Jackson, N.J.; Sorin Davidovici, Jackson Heights, N.Y.

[73] Assignee: Golden Bridge Technology, Inc., West Long Beach, Calif.

[21] Appl. No.: 701,440

[22] Filed: Aug. 22, 1996

[51] Int. Cl.$^6$ ................................................ H04B 1/707
[52] U.S. Cl. ................. 375/207; 375/343; 364/724.11
[58] Field of Search ........................... 375/200, 207, 375/343, 206; 364/724.01, 724.11, 754, 757–758, 724.13

[56] References Cited

U.S. PATENT DOCUMENTS

| | | | |
|---|---|---|---|
| 4,044,241 | 8/1977 | Hatley, Jr. | 364/724.11 |
| 4,112,372 | 9/1978 | Holmes et al. | 325/321 |
| 4,418,393 | 11/1983 | Zscheile, Jr. | 364/724 |
| 4,426,630 | 1/1984 | Folkmann | 333/174 |
| 4,441,194 | 4/1984 | Kingston et al. | 364/724.11 |
| 4,583,048 | 4/1986 | Gumacos et al. | 329/122 |
| 4,630,283 | 12/1986 | Schiff | 375/1 |
| 4,653,069 | 3/1987 | Roeder | 380/31 |
| 4,660,164 | 4/1987 | Leibowitz | 364/728 |
| 4,672,658 | 6/1987 | Kauehrad et al. | 379/63 |
| 4,691,326 | 9/1987 | Tsuchiya | 375/1 |
| 4,707,839 | 11/1987 | Andren et al. | 375/1 |
| 4,730,340 | 3/1988 | Frazier, Jr. | 375/1 |
| 4,755,483 | 7/1988 | Masak et al. | 370/6 |
| 4,759,034 | 7/1988 | Nagazumi | 375/1 |
| 4,860,307 | 8/1989 | Nakayama | 375/1 |
| 4,912,722 | 3/1990 | Carlin | 375/1 |
| 4,969,159 | 11/1990 | Belcher et al. | 375/1 |
| 5,031,142 | 7/1991 | Clark | 375/1 |
| 5,293,398 | 3/1994 | Hamao et al. | 375/207 |
| 5,311,544 | 5/1994 | Park et al. | 375/1 |

OTHER PUBLICATIONS

J.H. Cafarella et al., "Acoustoelectric Convolvers for Programmable Matched Filtering in Spread–Spectrum Systems", Proceedings of the IEEE, vol. 64, No. 5, pp. 756–759.

*Primary Examiner*—Temesghen Ghebretinsae
*Attorney, Agent, or Firm*—David Newman & Associates, P.C.

[57] ABSTRACT

A superior and scaleable architecture for implementing a large bit matched filter. The implementation of the bit matched filter requires less silicon and consumes less power as compared to the existing design. An effective way to turn the bit matched filter on and off for power saving is also disclosed.

31 Claims, 13 Drawing Sheets

SYMBOL-MATCHED FILTER HAVING A LOW SILICON AND POWER REQUIREMENT

BACKGROUND OF THE INVENTION

This invention relates to spread-spectrum communications, and more particularly to an architecture for implementing a bit matched filter requiring less silicon and consuming less power, as compared to existing designs.

DESCRIPTION OF THE RELEVANT ART

A bit-matched filter normally is used for correlating an input signal with a reference signal. The term "bit-matched filter", as used herein, is a matched filter matched to a particular chip-sequence signal, where the number of chips matched in the bit-matched filter equates to an information bit. The chip sequence is used for spreading the information bits at a spread-spectrum transmitter.

Correlating with the bit-matched filter is accomplished by multiplying a set of N samples of the input signal with the reference signal, then summing the product terms as follows:

$$S(N) = \sum_{i=1}^{N} \{d_y, \ldots, d_1, d_0\}_i * R_i$$

where N is the number of taps of the bit matched filter, S(N) is the sum of the product terms, $d\{y, \ldots, 0\}$ are the data samples with (y+1) bit resolution, and $R_i$ reference signal samples. N and y are positive integer numbers.

There are a number of different architectures for implementing a bit-matched filter disclosed in the prior art. One such method is tabulated in table 1, for comparing with the bit-matched filter of the instant invention.

For this example, the prior art bit-matched filter is assumed to have N=512 samples, with four bits per sample. The prior art bit-matched filter, requires four banks of shift registers of 512 registers per bank, for a total of 2048 registers. Also 2048 exclusive-OR (XOR) gates are required for implementing one bit multiplier function.

For the adder function, the requirements are: 1024 four bit adders, 512 five bit adders, 256 six bit adders, 128 seven bit adders, 64 eight bit adders, 32 nine bit adders, 16 ten bit adders, 8 eleven bit adders, 4 twelve bit adders, 2 thirteen bit adders and 1 fourteen bit adders.

With some technologies, data can not be propagated through 11 levels of adder blocks and meet the setup time at the next functional block, pipeline register banks are normally required.

SUMMARY OF THE INVENTION

A general object of the invention is a matched filter having a low silicon and a low power requirement.

Another object of the invention is a bit-matched filter requiring fewer exclusive-OR gates, compared to the prior art bit-matched filter.

According to the present invention, as embodied and broadly described herein, a spread-spectrum-matched filter is provided for use as part of a spread-spectrum receiver on a received-spread-spectrum signal. The received-spread-spectrum signal has a plurality of information bits, and is generated at a spread-spectrum spectrum transmitter by spread-spectrum processing each information bit with a chip-sequence signal. The present invention for the spread-spectrum matched filter is taught, by way of example, by breaking a filter length into two halves of length N/2 each where N is the number of taps on the matched filter. The spread-spectrum matched filter may have the filter length broken into more sections, e.g., four sections of length N/4, eight sections of length N/8, etc., by extending the concepts taught herein for two sections.

The spread-spectrum-matched filter can be used as part of a spread-spectrum receiver, for receiving a spread-spectrum signal. A received-spread-spectrum signal, as used herein, is a spread-spectrum signal arriving at the input of the spread-spectrum receiver. Timing for the present invention may be triggered from a header as part of a packet or from a pilot-spread-spectrum channel. For the case of the header, the received-spread-spectrum signal is assumed to include a plurality of packets. Each packet has a header followed in time by data. The header and data are sent as a packet, and the timing for the data in the packet is keyed from the header. The data may contain information such as digitized voice, signalling, adaptive power control (APC), cyclic-redundancy-check (CRC) code, etc.

The header, or preamble, is generated from spread-spectrum processing a header-symbol-sequence signal with a chip-sequence signal. The data part of the packet is generated from spread-spectrum processing a data-symbol-sequence signal with the chip-sequence signal. The chip-sequence signal for spread-spectrum processing the header-symbol-sequence signal and the data-symbol-sequence signal are preferably, but do not have to be, the same.

The spread-spectrum-matched filter, having a filter length of two halves, includes a first plurality of shift registers, a second plurality of shift registers, a control processor, a multiplexer, a plurality of data-shift registers, a plurality of exclusive-OR (XOR) gates, an adder tree, a memory and an adder. The first plurality of shift registers stores a first portion of a reference-chip-sequence signal, and the second plurality of shift registers stores a second portion of the reference-chip-sequence signal. The processor generates a clock signal. In response to the clock signal, the multiplexer outputs, sequentially, a first portion of the chip-sequence signal during a first portion of the clock cycle, and then a second portion of the chip-sequence signal during a second portion of the clock cycle.

The plurality of data-shift registers shifts input data samples of the received-spread-spectrum signal at the clock rate. During each clock cycle, the XOR gates multiply, sequentially, the first portion of the chip-sequence signal by the plurality of input data samples. This multiplication generates a first plurality of product-output signals. Then, the XOR gates multiply the second portion of the chip-sequence signal by the plurality of input data samples. This multiplication generates a second plurality of product-output signals.

During the first portion of the clock cycle, the adder tree sums the first plurality of product-output signals to generate a first sum. The first sum is stored in the memory. During the second portion of the clock cycle, the adder tree sums the second plurality of product-output signals to generate a second sum. The adder adds the first sum, from the memory, with the second sum, from the adder tree.

Additional objects and advantages of the invention are set forth in part in the description which follows, and in part are obvious from the description, or may be learned by practice of the invention. The objects and advantages of the invention also may be realized and attained by means of the instrumentalities and combinations particularly pointed out in the appended claims.

BRIEF DESCRIPTION OF THE DRAWINGS

The accompanying drawings, which are incorporated in and constitute a part of the specification, illustrate preferred embodiments of the invention, and together with the description serve to explain the principles of the invention.

DETAILED DESCRIPTION OF THE PREFERRED EMBODIMENTS

Figure 1:
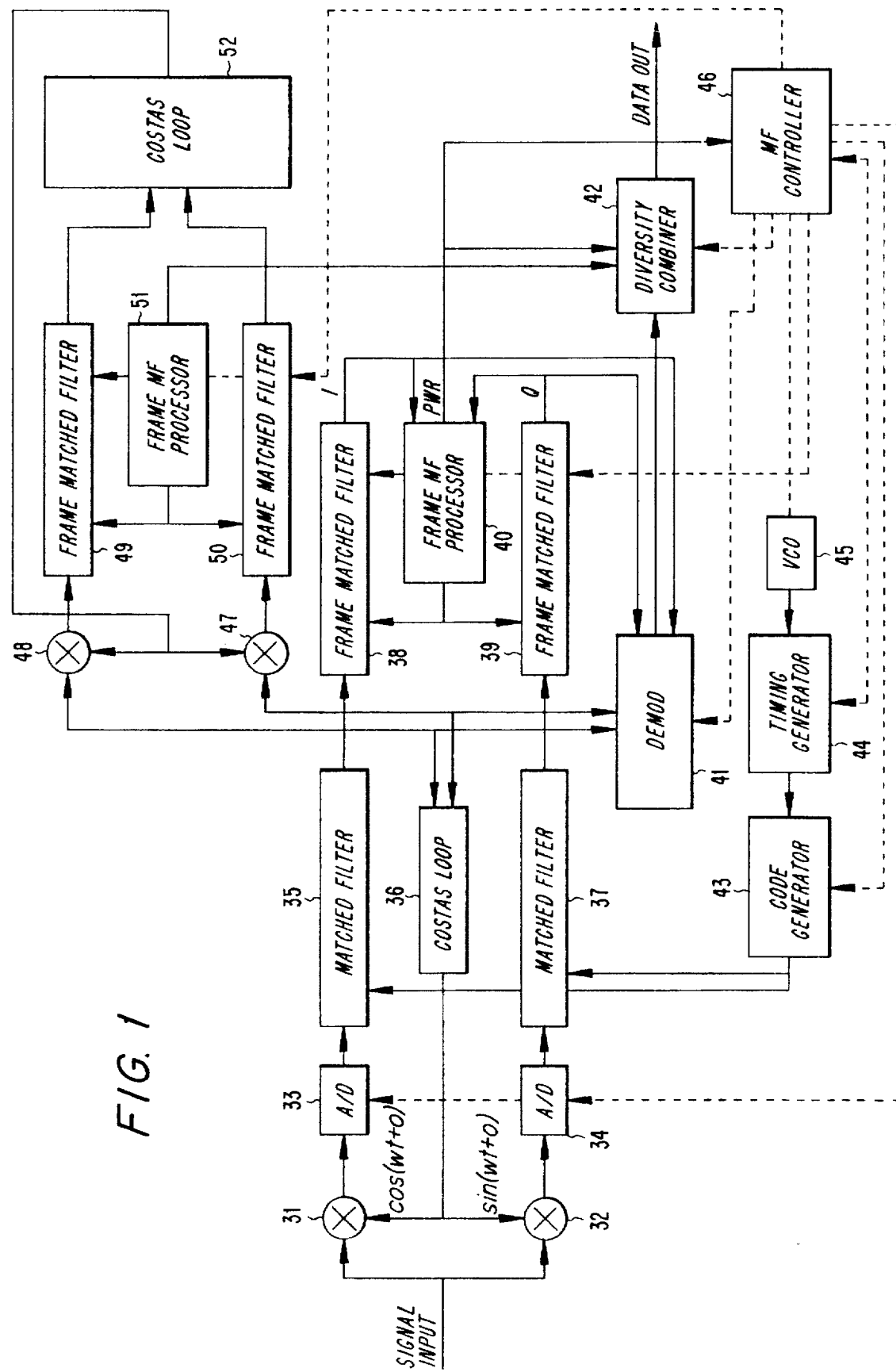
FIG. 1 is a block diagram of a signal-time-sharing, matched-filter-based demodulator.

Reference now is made in detail of the present preferred embodiments of the invention, examples of which are illustrated in the accompanying drawings, wherein like reference numerals indicate like elements throughout the several views.

The present invention provides a new and novel spread-spectrum-matched filter, illustrated in FIGS. 1–6, for use as part of a spread-spectrum receiver on a received-spread-spectrum signal. The received-spread-spectrum signal is generated at a spread-spectrum transmitter, by spread-spectrum processing each information bit with a chip-sequence signal. Preferably, the same chip-sequence signal is used for each information bit, and is properly inverted whether the bit is a one bit or zero bit.

The received-spread-spectrum signal, in a preferred embodiment, is assumed to include a plurality of packets. Each packet has a header followed in time by data. The header is generated from spread-spectrum processing, by using techniques well known in the art, a header-symbol-sequence signal with a chip-sequence signal. The header-symbol-sequence signal is a predefined sequence of symbols. The header-symbol-sequence signal may be a constant value, i.e., just a series of 1-bits or symbols, or a series of 0-bits or symbols, or alternating 1-bits and 0-bits or alternating symbols, a pseudorandom symbol sequence, or other predefined sequence as desired. The chip-sequence signal is user defined, and in a usual practice, is used with a header-symbol-sequence signal.

The data part of the spread-spectrum packet is generated similarly, from techniques well known in the art as used for the header, by spread-spectrum processing a data-symbol-sequence signal with the chip-sequence signal. The data-symbol-sequence signal may be derived from data, or an analog signal converted to data, signalling information, or other source of data symbols or bits. The chip-sequence signal can be user defined, and preferably is nearly orthogonal to other spread-spectrum channels using the chip-sequence signal, as is well known in the art.

The present invention alternatively may operate on a received-spread-spectrum signal, which is assumed to have a data-spread-spectrum channel and a pilot spread-spectrum channel. The pilot-spread-spectrum channel is generated from spread-spectrum processing, by using techniques well known in the art, a pilot-bit-sequence signal with a pilot-chip-sequence signal. The pilot-bit-sequence signal may be a constant level, i.e., just a series of 1-bits, or a series of 0-bits, or alternating 1-bits and 0-bits, or other sequence as desired. Typically, data are not sent with a pilot-bit-sequence signal. In some applications, data, preferably with a low data rate, may be imposed on the pilot-bit-sequence signal. The pilot-chip-sequence signal is user-defined, and in a usual practice, is used with a pilot-bit-sequence signal.

The data-spread-spectrum channel is generated similarly, from techniques well known in the art, by spread-spectrum processing a data-bit-sequence signal with a data-chip-sequence signal. The data-bit-sequence signal may be derived from data, or analog signal converted to data, or other source of data bits. The data-chip-sequence signal can be user-defined, and preferably is orthogonal to other users' chip sequence signal, as is well known in the art.

Programmable Matched Filter Using a Header

For an embodiment using packets, and headers for synchronization, the reference means generates a replica of the chip-sequence signal. The replica of the chip-sequence signal is the same sequence as used for generating, at a spread-spectrum transmitter, the received-spread-spectrum signal which arrives at the input of the spread-spectrum-matched-filter apparatus. The reference means can change, over time, the particular chipping sequence from which the replica of the chip-sequence signal is generated. Accordingly, the spread-spectrum-matched-filter apparatus can be used for a variety of chip-sequence signals as generated by the reference means, as might be used in a cellular-spread-spectrum architecture where a receiver might move from one geographical area to another. As the spread-spectrum-matched-filter apparatus moves from one geographical area to another, by way of example, a requirement might be imposed to change the chip-sequence signal in each of the different geographical areas. Similarly, each transmitter within the geographical area of a base station may have a different chip sequence.

For the embodiment using a header for synchronization, the symbol-matched means has a symbol-impulse response. The symbol-impulse response can be set from the replica of the chip-sequence signal generated by the reference means. Thus, the symbol-impulse response may be set for filtering from the received-spread-spectrum signal, the header and the data-symbol-sequence signal. With the symbol-impulse response set to the replica of the chip-sequence signal, and with the header portion of the received-spread-spectrumsignal being present at the receiver, the symbol-matched means outputs a despread-header-symbol-sequence signal. Upon detecting the despread-header-symbol sequence, the frame-matched means outputs a high level signal which may be used as a start-data signal. Other uses may be to synchronize the sequence of transmit, switching and receive cycles or to generate a timing signal for any other event that is related in time to the header.

The symbol-matched means continues to have the symbol-impulse response set from the replica of the chip-sequence signal. When the data portion of the received-spread-spectrum signal is present at the receiver, the symbol-matched means filters the received-spread-spectrum signal. Timing to sample the data portion of the received-spread-spectrum signal is triggered from the start-data signal. Thus, the symbol-matched means outputs the despread-data-symbol-sequence signal. Accordingly, the symbol-matched means can despread the header and the data portion of the received-spread-spectrum signal.

For the embodiment using the header for synchronization, the frame-matched means has a frame-impulse response matched to the header-symbol-sequence signal. Thus, the frame-matched means filters the despread-header-symbol-sequence signal from the symbol-matched means, and generates as a result thereof, a start-data signal when the despread-header-symbol-sequence signal matches the frame-impulse response. The frame-matched means may be programmable, i.e., have a programmable frame-impulse response, which might change between different geographical areas.

The control means controls the setting of the symbol-impulse response of the symbol-matched means. The control means can dynamically set the symbol-matched means, by using the replica of the chip-sequence signal generated by the reference means, to match the chip-sequence signal embedded in the received-spread-spectrum signal.

The symbol-matched means may include an in-phase-symbol-matched means and a quadrature-phase-symbol-matched means. The in-phase-symbol-matched means has an in-phase-symbol-impulse response which can be set from the replica of the chip-sequence signal generated by the reference means. Depending on which setting the in-phase-symbol-matched means has, the in-phase-symbol-matched means despreads from the received-spread-spectrum signal, an in-phase-component of the header portion of the packet as a despread-in-phase-component of the header-symbol-sequence signal, or an in-phase component of the data portion of the packet as a despread-in-phase component of the data-symbol-sequence signal.

The quadrature-phase-symbol-matched means has a quadrature-impulse response which can be set from the replica of the chip-sequence signal generated by the reference means. When the quadrature-phase-symbol-matched means has the quadrature-impulse response matched to the chip-sequence signal, the quadrature-phase-symbol-matched means despreads from the received-spread-spectrum signal a quadrature-phase component of the header portion of the packet as a despread-quadrature-phase component of the header-symbol-sequence signal. Similarly, when the quadrature-phase-symbol-matched means has the quadrature-symbol-impulse response set from the replica of the chip-sequence signal, the quadrature-phase-symbol-matched means despreads the received-spread-spectrum signal as a quadrature-component of the data portion of the packet as a despread-quadrature-phase component of the despread data-symbol-sequence.

In use, the control means sets the in-phase-symbol-matched means and the quadrature-phase-symbol-matched means matched to detect the chip-sequence signal. The in-phase-symbol-matched means and the quadrature-phase-symbol-matched means are matched simultaneously, and preferably are matched to the same chip-sequence signal.

The frame-matched means may include an in-phase-frame-matched means and a quadrature-phase-frame-matched means. The in-phase-frame-matched means has an in-phase-frame-impulse response matched to an in-phase component of the header-symbol-sequence signal. When the in-phase component of the despread-header-symbol-sequence signal from the in-phase-symbol-matched means matches the in-phase-frame-impulse response, then an in-phase-start-data signal is generated.

The quadrature-phase-frame-matched means has a quadrature-phase-frame-impulse response matched to a quadrature-phase component of the header-symbol-sequence signal. When the quadrature-phase component of the despread-header-symbol-sequence signal matches the quadrature-phase-frame-impulse response of the quadrature-phase-frame-matched means, then a quadrature-phase-start-data signal is generated. In practice, the in-phase-start-data signal and the quadrature-phase-start-data signal are generated simultaneously, but they may also occur at different times.

The in-phase-start-data signal and the quadrature-phase-start data signal are combined as the start-data signal. Timing for sampling the output of the in-phase-symbol-matched means and the quadrature-phase-symbol-matched means for detecting the data-symbol-sequence signal is triggered, at a time delay, from the start-data signal. The time delay may be zero.

In the exemplary arrangement shown in FIG. 1, the reference means is embodied, by way of example, as a code generator 43, the symbol-matched means is embodied as an in-phase-symbol-matched filter 35 and a quadrature-phase symbol-matched filter 37, the frame-matched means is embodied as an in-phase-frame-matched filter 38 and a quadrature-phase-frame-matched filter 39, the control means is embodied as a controller 46, and the demodulator means is embodied as a demodulator 41. The in-phase-symbol-matched filter 35 and the quadrature-phase-symbol-matched filter 37 may be constructed as digital-matched filters, surface-acoustic-wave devices, or as software embedded in a processor or as an application specific integrated circuit (ASIC). Also shown is a voltage-controlled oscillator 45, timing generator 44, diversity combiner 42, frame processor 40, Costas loop 36 or other generic tracking loop, in-phase analog-to-digital converter 33, quadrature-phase analog-to-digital converter 34, in-phase mixer 31, and quadrature-phase mixer 32.

The in-phase analog-to-digital converter 33 is coupled between in-phase mixer 31 and in-phase-symbol-matched filter 35. The quadrature-phase analog-to-digital converter 34 is coupled between the quadrature-phase mixer 32 and the quadrature-phase-symbol-matched filter 37. The Costas loop 36 is coupled to the output of the in-phase-symbol-matched filter 35, to the output of the quadrature-phase-symbol-matched filter 37, and to the in-phase mixer 31 and the quadrature-phase mixer 32. The in-phase-frame-matched filter 38 is coupled between the in-phase-symbol-matched filter 35 and the frame processor 40 and the demodulator 41. The quadrature-phase-frame-matched filter 39 is coupled between the quadrature-phase-symbol-matched filter 37 and the processor 40 and the demodulator 41. The code generator 43 is coupled between the timing generator 44 and the in-phase-symbol-matched filter 35 and the quadrature-phase-frame-matched filter 37. The timing control circuit controls the sampling instant of the analog-to-digital converter timing generator 44 to the in-phase-symbol-matched filter 35 and the quadrature-phase-symbol-matched filter 37. The voltage-controlled oscillator 45 is coupled to the timing generator 44 and to the matched-filter controller 46. The diversity combiner 42 is coupled to the frame processor 40 and the demodulator 41. The controller 46 is coupled to the frame processor 40. The prefixes "in-phase" and "quadrature-phase" denote that component, i.e., in-phase or quadrature-phase, of the received-spread-spectrum signal, with which the element operates.

The in-phase analog-to-digital converter 33 and the quadrature-phase analog-to-digital converter 34 may be embodied as a hard limiter which performs one-bit analog-to-digital conversion, or as an N-bit analog-to-digital converter. Analog-to-digital converters are well known in the art.

For control, indicated by broken lines, the controller 46 is coupled to the diversity combiner 42, the frame-matched filter 38, the frame-matched filter 39, the demodulator 41, the timing generator 44, the code generator 43, the in-phase-analog-to-digital converter 33, and the quadrature-phase-analog-to-digital converter 34.

For RAKE applications, additional sections of frame-matched filters would be required. Thus, an additional in-phase mixer 48 and quadrature-phase mixer 47, and in-phase-frame-matched filter 49 and quadrature-phase-frame-matched filter 50 would be used with a second frame-matched-filter processor 51 and Costas loop 52. The application RAKE is well known in the art, and thus the addition of the additional frame-matched filter section would be easily recognizable to those skilled in the art.

Referring to FIG. 1, a received-spread-spectrum signal at the signal input is translated to an intermediate frequency or baseband frequency by in-phase mixer 31 and quadrature-phase mixer 32. For discussion purposes, the received-spread-spectrum signal is assumed to be translated to a baseband frequency. The portion of the spread-spectrum receiver which includes low noise amplifiers, automatic-gain-control (AGC) circuits, filters, etc., is well known in the art, and therefore, is not shown. The baseband received-spread-spectrum signal is converted to a digital signal by in-phase analog-to-digital converter 33 and quadrature-phase analog-to-digital converter 34. Thus, a baseband version of the received-spread-spectrum signal is at the input of the in-phase-symbol-matched filter 35 and the quadrature-phase-symbol-matched filter 37.

The in-phase-symbol-matched filter 35 has an in-phase-symbol-impulse response which is set by the replica of the chip-sequence signal from code generator 43. Depending on the setting, the in-phase-symbol-matched filter 35 can despread the received-spread-spectrum signal as a despread-in-phase component of the header-symbol-sequence signal or as a despread-in-phase component of the spread-spectrum-processed data-symbol-sequence signal. Accordingly, the in-phase-symbol-matched filter 35 outputs either a despread-in-phase component of the header-symbol-sequence signal, or a despread-in-phase component of the spread-spectrum-processed data-symbol-sequence signal as a despread-in-phase-data-symbol-sequence signal.

Similarly, the quadrature-phase-symbol-matched filter 37 has a symbol-impulse response which can be set by the replica of the chip-sequence signal generated by the code generator 43. Depending on the setting, the quadrature-phase-symbol-matched filter 37 despreads the received-spread-spectrum signal as a quadrature-phase component of the header-symbol-sequence signal or as a quadrature-phase component of the spread-spectrum-processed data-symbol-sequence signal. Accordingly, the output of the quadrature-phase-symbol-matched filter 37 is either a despread-quadrature-phase component of the header-symbol-sequence signal or a despread-quadrature-phase component of the spread-spectrum-processed data-symbol-sequence signal as a despread-quadrature-phase-data-symbol-sequence signal.

The in-phase-symbol-matched filter 35 and the quadrature-phase-symbol-matched filter 37 are ultimately controlled by the controller 46. The controller 46 controls timing and determines at desired timings when the code generator 43 sets the symbol-impulse responses of the in-phase-symbol-matched filter 35 and the quadrature-phase-symbol-matched filter 37 to the respective chip-sequence signal being used in a particular geographic area.

Figure 2:
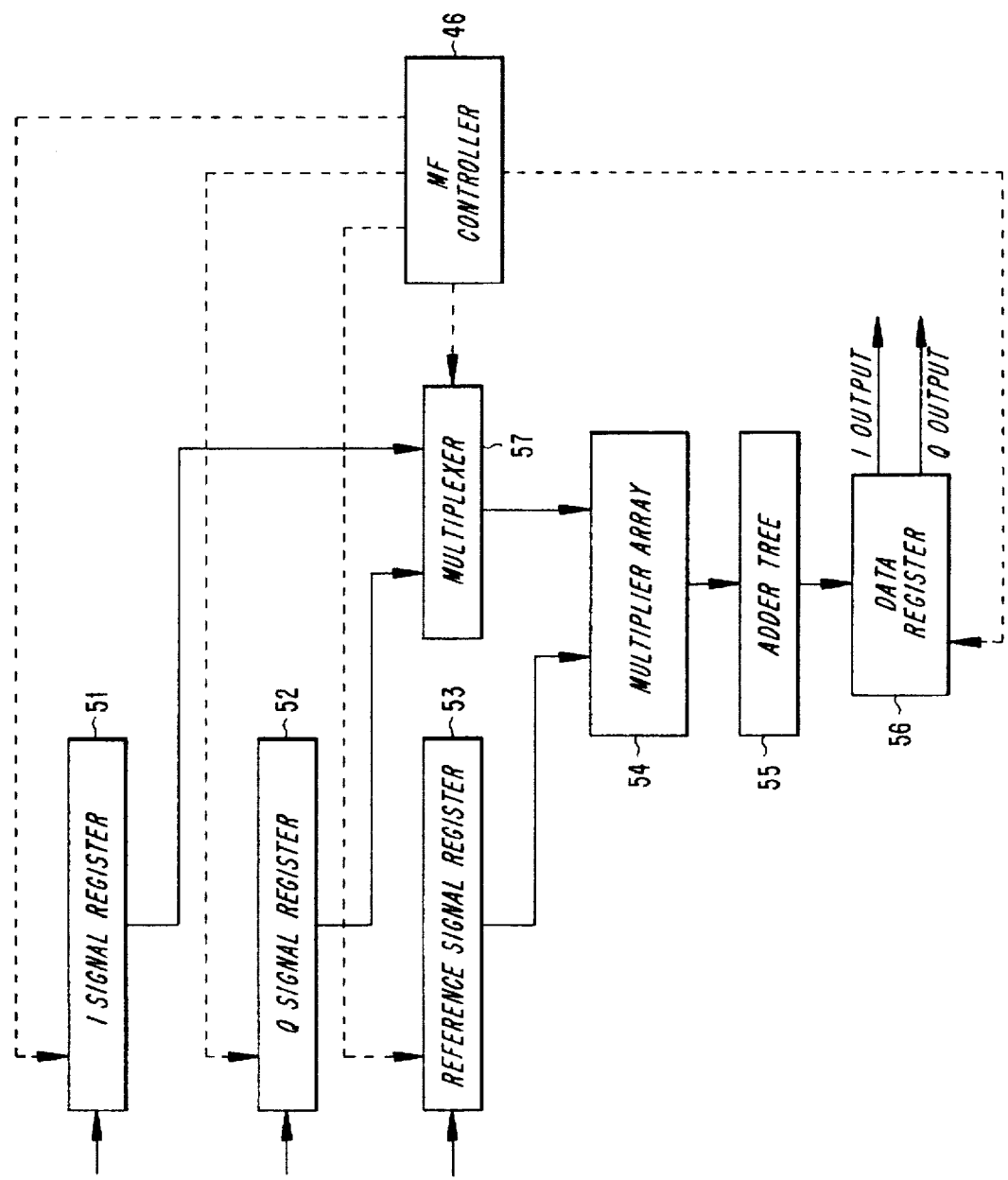
FIG. 2 illustrates a matched filter using time sharing of multiplier array and adder tree.

As shown in FIG. 2, the controller 46 controls the in-phase signal register 51 and the quadrature-phase signal register 52, which correspond to the in-phase-symbol-matched filter 35 and the quadrature-phase-symbol-matched filter 37, respectively.

In FIG. 1, the Costas loop 36 uses the output from the in-phase-symbol-matched filter 35 and the output from the quadrature-phase-symbol-matched filter 37 to generate the cosine signal and sine signal for in-phase mixer 31 and quadrature-phase mixer 32, respectively.

The spread-spectrum receiver receives packets of header and data, which may arrive as a stream of uninterrupted packets in a frequency division duplex (FDD) application, or as separate packets in a time division duplex (TDD) application. The despread and detected header provides timing and synchronization for data within a respective packet.

Figure 3:
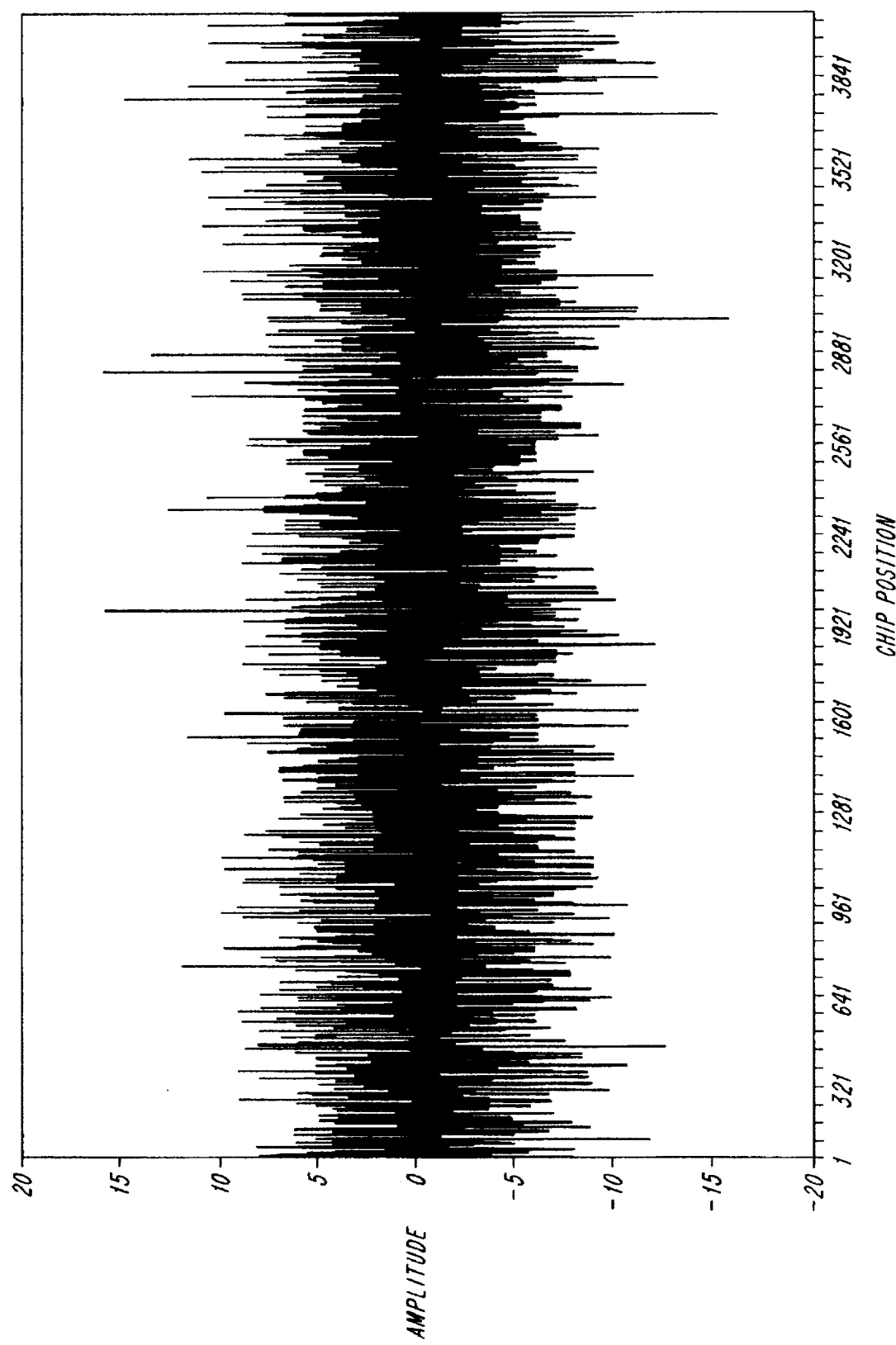
FIG. 3 is an example output signal from the symbol-matched filter.
Figure 4:
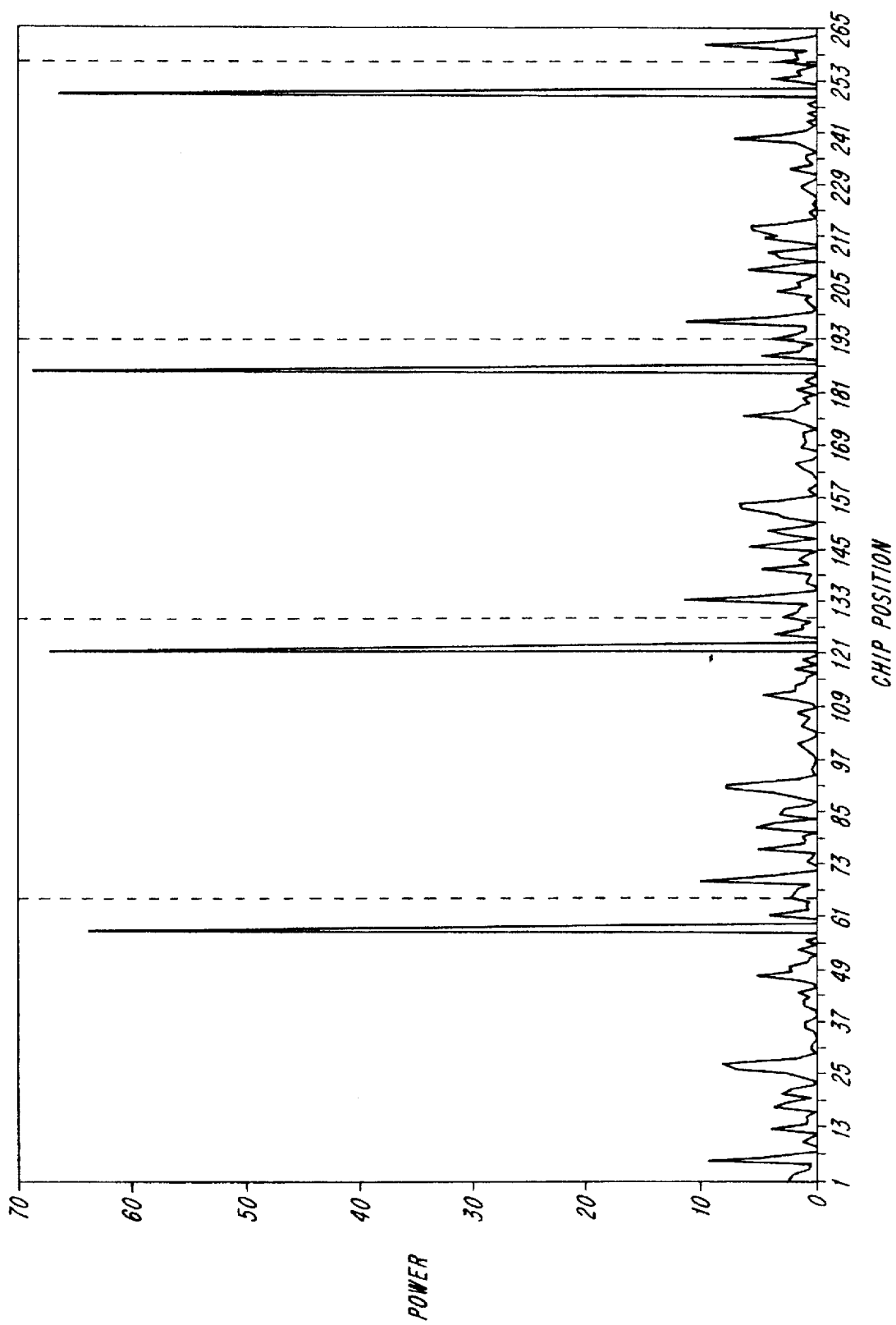
FIG. 4 is an example output signal from the frame-matched filter.

When the in-phase-symbol-matched filter 35 and quadrature-phase-symbol-matched filter 37 have their respective symbol-impulse responses matched to the chip-sequence signal, and the header portion of the packet of the received-spread-spectrum signal is present at the receiver input, then the output is a despread-header-symbol-sequence signal. An example of a signal outputted as a despread-header-symbol-sequence signal is illustrated in FIG. 3. The despread-header-symbol-sequence signal is passed through in-phase-frame-matched filter 38 and quadrature-phase-frame-matched filter 39. The in-phase-frame-matched filter 38 has an in-phase-frame-impulse response matched to the in-phase component of the header-symbol-sequence signal, and accordingly, generates an in-phase-start-data signal when the in-phase component of the despread-header-symbol-sequence signal matches the in-phase-frame-impulse response. Similarly, the quadrature-phase-frame-matched filter 39 has a quadrature-phase-frame-impulse response matched to a quadrature-phase component of the header-symbol-sequence signal. When the despread-header-symbol-sequence signal from the quadrature-phase-symbol-matched filter 37 matches the quadrature-phase-frame-impulse response of the quadrature-phase-matched filter 37, then the quadrature-phase-frame-matched filter outputs a quadrature-phase-start-data signal. An example of a signal outputted from the frame-matched filter is illustrated in FIG. 4. The large spike's, i.e., large signal levels, are the start-data signal referred to herein. These spikes or start-data signals serve as timing references to synchronize timing, as disclosed herein. The in-phase-start-data signal and the quadrature-phase-start-data signal are demodulated by demodulator 41, and can be used as an initial timing signal for controlling when the diversity combiner 42 combines the output from the demodulator 41 for the respective signals from in-phase-symbol-matched filter 35 and the quadrature-phase-symbol-matched filter 37.

Additionally, the in-phase-start-data signal and the quadrature-phase-start-data signal can be processed by frame processor 40 to trigger a timing signal, i.e., the start-data signal, to the controller 46 which actuates the timing for when to sample the outputs of the in-phase-symbol-matched filter 35 and the quadrature-phase-symbol-matched filter 37, for detecting the data-symbol-sequence signal.

In a particular implementation of the present invention, the in-phase-symbol-matched filter 35 and the quadrature-phase-symbol-matched filter 37 have their respective in-phase-symbol-impulse response and quadrature-phase-symbol-impulse response determined, under the control of the controller 46, such that they are matched to the chip-sequence signal within 6.4 microseconds (64 chips at 10 Mchips/sec). Typically, current designs have these respective symbol-matched filters loaded within 12.8 microseconds, for a system operating at 100 MHz, with each of the in-phase-symbol-matched filter 35 and the quadrature-phase-symbol-matched filter 37 having a 256 stage shift register (256 chips at 20 Mchips/sec).

The demodulator 41 can be implemented using coherent demodulation, or alternatively using noncoherent demodulation.

The diversity combiner 42 combines in a variety of ways, such as maximum likelihood, straight combining, addition, or the demodulated outputs from the in-phase-symbol-matched filter 35 and the quadrature-phase-symbol-matched filter 37 as demodulated through demodulator 41.

FIG. 2 illustrates the matched filter using the time sharing of the multiplier array and adder tree. Shown in FIG. 2 are in-phase-signal register 51, quadrature-phase-signal register 52, reference-signal register 53, multiplier array 54, adder tree 55, data register 56, and controller 46. As shown, the dotted lines indicate that the controller 46 provides the necessary controlling of the in-phase-signal register 51, the quadrature-phase-signal register 52, the reference-signal reference 53 and the data register 56. The solid lines indicate the signal flow from the in-phase-signal register 51, the quadrature-phase-signal register 52, the reference-signal register 53 through the multiplexer 57. The in-phase-signal register 51 and the quadrature-phase-signal register 52 are coupled through multiplexer 57 to multiplier array 54 to adder tree 55 to data register 56. The data register 56 has an in-phase output and quadrature-phase output.

The present invention also includes a method which uses a symbol-matched filter and a frame-matched filter with a spread-spectrum receiver on a received-spread-spectrum signal. As with the apparatus previously disclosed, the received-spread-spectrum signal is assumed to have a plurality of packets, with each packet including a header and data portion. The header is generated from spread-spectrum processing a header-symbol-sequence signal with a chip-sequence signal. The data portion of the packet is generated from spread-spectrum processing a data-symbol-sequence signal with the chip-sequence signal.

The method comprises the steps of generating a replica of the chip-sequence signal. The method programs the symbol-matched filter with the replica of the chip-sequence signal to set the symbol-matched filter to have a symbol-impulse response matched to the chip-sequence signal. With the symbol-matched filter matched to the chip-sequence signal, the method despreads the header portion of the packet from the received-spread-spectrum signal as a despread header-symbol-sequence signal.

The frame-matched filter has a frame-impulse response matched to the header-symbol-sequence signal. The method therefore uses the frame-matched filter to filter the despread header-symbol-sequence signal. The method thereafter generates from the filtered despread-header-symbol-sequence signal, the data-start signal in response to the despread-header-symbol-sequence signal matching the frame-impulse response of the frame-matched filter.

The method also generates at a time delay from the data-start signal, a data-control signal. The time delay may be zero. In response to the data-control signal, the method programs the frame-matched filter with the replica of the data-chip-sequence signal so that the frame-matched filter has the frame-impulse response matched to the data-symbol-sequence signal. The method thereby despreads, while the frame-matched filter is matched to the data-symbol-sequence signal, the data-spread-spectrum channel from the received-spread-spectrum signal as a despread-data-symbol-sequence signal.

The method as described herein may be extended to in-phase and quadrature-phase components of a received-spread-spectrum signal. As such, the method would have the step of despreading the header portion of the packet from the received-spread-spectrum signal including the steps of despreading, from the received-spread-spectrum signal, the in-phase component of the header as a despread in-phase component of the header-symbol-sequence signal, and despreading, from the received-spread-spectrum signal, the quadrature-phase component of the header as a despread-quadrature-phase component of the header-symbol-sequence signal.

Similarly, the in-phase component and the quadrature-phase component of the received-spread-spectrum signal can be despread as in-phase components and quadrature-phase components of the data-symbol-sequence signal. Accordingly, the method would include despreading, from the received-spread-spectrum signal, an in-phase component of the data portion of the packet as a despread-in-phase component of the data-symbol-sequence signal. The method would also include despreading a quadrature-phase component of the data portion of the packet as a despread-quadrature-phase component of the data-symbol-sequence signal.

When filtering the despread header-symbol-sequence signal into in-phase components and quadrature-phase components, the method can also include generating an in-phase-start-data signal and a quadrature-phase-start-data signal, in response to the in-phase component and the quadrature-phase component of the despread header-symbol-sequence signal matching the in-phase-frame-impulse response and the quadrature-phase-frame-impulse response, respectively.

Programmable Matched Filter Using a Pilot Channel

For an embodiment using a pilot-spread-spectrum channel for synchronization, the reference means generates a replica of the pilot-chip-sequence signal and the data-chip-sequence signal. These replicas of the pilot-chip-sequence signal and the data-chip-sequence signal are the same sequences as used for generating the received-spreadspectrum signal which arrives at the input of the spread-spectrum-matched-filter apparatus. The reference means can change, over time, the particular chipping sequence from which the replica of the data-chip-sequence signal is generated. Accordingly, the spread-spectrum-matched-filter apparatus can be used for a variety of data-chip-sequence signals as generated by the reference means, as might be used in a cellular-spread-spectrum architecture where a receiver might move from one geographical area to another. As the spread-spectrum-matched-filter apparatus moves from one geographical area to another, by way of example, a requirement might be imposed of having to change the pilot-chip-sequence signal and the data-chip-sequence signal in each of the different geographical areas.

For the embodiment using the pilot-spread-spectrum channel for synchronization, the symbol-matched means has an impulse response which is programmable, denoted herein as the symbol-impulse response. The symbol-impulse response can be set from the replica of the data-chip-sequence signal generated by the reference means. Thus, the symbol-impulse response may be set for filtering from the received-spread-spectrum signal, the header and data. With the symbol-impulse response set to the replica of the pilot-chip-sequence signal, and with the pilot-spread-spectrum channel at the receiver, the symbol-matched means outputs a despread-pilot-bit-sequence signal.

When the symbol-matched means has the symbol-impulse response set from the replica of the data-chip-sequence signal, then the symbol-matched means filters from the received-spread-spectrum signal, the data-spread-spectrum channel. Thus, the symbol-matched means can output the despread-data-bit-sequence signal, which includes the header, signalling, APC data, etc. Accordingly, the symbol-matched means can despread the data-spread-spectrum channel. As set forth below, the symbol-matched means changes dynamically, while receiving the received-spread-spectrum signal, allowing the symbol-matched means to be time shared while receiving the in-phase chip sequence signal and the quadrature-phase chip-sequence signal.

For the embodiment using the pilot spread-spectrum channel for synchronization, the frame-matched means has a frame-impulse response matched to the symbol-matched filter output. Thus, the frame-matched means filters the despread-pilot-bit-sequence signal from the symbol-matched means, and generates as a result thereof, a peak-correlation signal when the despread-pilot-bit-sequence signal matches the frame-impulse response. The frame-matched means may have a programmable-frame-impulse response, which might change between different geographical areas or for different users.

The control means controls the setting of the symbol-impulse response of the symbol-matched means. The control means can dynamically set the symbol-matched means, by using the replica of the pilot-chip-sequence signal generated by the reference means, to match the pilot-chip-sequence signal embedded in the received-spread-spectrum signal. The control means can dynamically set the symbol-matched means, by using the replica of the data-chip-sequence signal generated by the reference means, to match the data-chip-sequence signal. The control means can set the symbol-impulse response alternately, at various time delays, so that the symbol-matched means alternately detects the in-phase sequence signal and the quadrature-phase sequence signal embedded in the received-spread-spectrum signal.

The symbol-matched means may include an in-phase-symbol-matched means and a quadrature-phase-symbol-matched means. The in-phase-symbol-matched means has an in-phase-symbol-impulse response which can be set from the replica of the data-chip-sequence signal generated by the reference means. Depending on which setting the in-phase-symbol-matched means has, the in-phase-symbol-matched means despreads from the received-spread-spectrum signal, an in-phase-component of the pilot-spread-spectrum signal channel as a despread-in-phase-component of the pilot-bit-sequence signal, or an in-phase component of the data-spread-spectrum channel as a despread-in-phase component of the data-bit-sequence signal.

The quadrature-phase-symbol-matched means has a quadrature-impulse response which can be set from the replica of the data-chip-sequence signal generated by the reference means. When the quadrature-phase-symbol-matched means has the quadrature-impulse response matched to the pilot-chip-sequence signal, the quadrature-phase-symbol-matched means despreads from the received-spread-spectrum signal a quadrature-phase component of the pilot-spread-spectrum channel as a despread-quadrature-phase component of the pilot-bit-sequence signal. Similarly, when the quadrature-phase-symbol-matched means has the quadrature-symbol-impulse response set from the replica of the data-chip-sequence signal, the quadrature-phase-symbol-matched means despreads the received-spread-spectrum signal as a quadrature-component of the data-spread-spectrum channel as a despread-quadrature-phase component of the despread data-bit-sequence.

In use, the control means has the in-phase-symbol-matched means and the quadrature-phase-symbol-matched means time synchronized so that they are matched to detect the data-chip-sequence signal. This dynamic changing of the in-phase-symbol-matched means and the quadrature-phase-symbol-matched means is done alternately during reception of a spread-spectrum signal, time sharing these elements for detecting the data-chip-sequence signal embedded in the received-spread-spectrum signal. The frame-matched means may include an in-phase-frame-matched means and a quadrature-phase-frame-matched means. The in-phase-frame-matched means has an in-phase-frame-impulse response matched to an in-phase component of the header-bit-sequence signal. When the in-phase component of the despread-pilot-bit-sequence signal from the in-phase-symbol-matched means matches the in-phase-frame-impulse response, then an in-phase-peak-header-correlation signal is generated.

The quadrature-phase-frame-matched means has a quadrature-phase-frame-impulse response matched to a quadrature-phase component of the header-bit-sequence signal. When the quadrature-phase component of the despread-header-bit-sequence signal matches the quadrature-phase-frame-impulse response of the quadrature-phase-frame-matched means, then a quadrature-phase-peak-header-correlation signal is generated.

In the exemplary arrangement shown in FIG. 1, the reference means is embodied as a code generator 43, the symbol-matched means is embodied as an in-phase-symbol-matched filter 35 and a quadrature-phase symbol-matched filter 37, the frame-matched means is embodied as an in-phase-frame-matched filter 38 and a quadrature-phase-frame-matched filter 39, the control means is embodied as a controller 46, and the demodulator means is embodied as a demodulator 41. The in-phase-symbol-matched filter 35 and the quadrature-phase-symbol-matched filter 37 may be constructed as digital-matched filters, surface-acoustic-wave devices, or as software embedded in a processor or as an application specific integrated circuit (ASIC). Also shown is a voltage-controlled oscillator 45, timing generator 44, diversity combiner 42, frame processor 40, Costas loop 36 (or other generic tracking loop), in-phase analog-to-digital converter 33, quadrature-phase analog-to-digital converter 34, in-phase mixer 31, and quadrature-phase mixer 32.

The in-phase analog-to-digital converter 33 is coupled between in-phase mixer 31 and in-phase-symbol-matched filter 35. The quadrature-phase analog-to-digital converter 34 is coupled between the quadrature-phase mixer 32 and the quadrature-phase-symbol-matched filter 37. The Costas loop 36 is coupled to the output of the in-phase-symbol-matched filter 35, to the demodulator 41, and to the in-phase mixer 31 and the quadrature-phase mixer 32. The in-phase-frame-matched filter 38 is coupled between the in-phase-symbol-matched filter 35 and the frame processor 40 and the demodulator 41. The quadrature-phase-frame-matched filter 39 is coupled between the quadrature-phase-symbol-matched filter 37 and the processor 40 and the demodulator 41. The code generator 43 is coupled between timing generator 44 and to the in-phase-symbol-matched filter 35 and the quadrature-phase-symbol-matched filter 37. The voltage controlled oscillator 45 is coupled to the timing generator 44 and to the matched-filter controller 46. The diversity combiner 42 is coupled to the frame processor 40 and the demodulator 41. The controller 46 is coupled to the frame processor 40. The prefixes "in-phase" and "quadrature-phase" denote that component, i.e., in-phase or quadrature-phase, of the received-spread-spectrum signal, with which the element operates.

The in-phase analog-to-digital converter 33 and the quadrature-phase analog-to-digital converter 34 may be embodied as a hard limiter which performs one-bit analog-to-digital conversion, or as an N-bit analog-to-digital converter. Analog-to-digital converters are well known in the art.

For control, indicated by broken lines, the controller 46 may be coupled to the diversity combiner 42, the in-phase-frame-matched filter 38, the quadrature-phase-frame-matched filter 39, the demodulator 41, the timing generator 44, the code generator 43, the in-phase-analog-to-digital converter 33, and the quadrature-phase-analog-to-digital converter 34.

Referring to FIG. 1, a received-spread-spectrum signal at the signal input is translated to an intermediate frequency or baseband frequency by in-phase mixer 31 and quadrature-phase mixer 32. For discussion purposes, the received-spread-spectrum signal is assumed to be translated to a baseband frequency. Thus, the baseband received-spread-spectrum signal is converted to a digital signal by in-phase analog-to-digital converter 33 and quadrature-phase analog-to-digital converter 34. Thus, a baseband version of the received-spread-spectrum signal is at the input of the in-phase-symbol-matched filter 35 and at the input of the quadrature-phase-symbol-matched filter 37.

The in-phase-symbol-matched filter 35 has an in-phase-symbol-impulse response which is set by the replica of the data-chip-sequence signal from code generator 43. Depending on the setting, the in-phase-symbol-matched filter 35 can despread the received-spread-spectrum signal as a despread-in-phase component of the data-spread-spectrum channel. Accordingly, the in-phase-symbol-matched filter 35 outputs a despread-in-phase component of the data-bit-sequence signal as a despread-data-bit-sequence signal.

Similarly, the quadrature-phase-symbol-matched filter 37 has a symbol-impulse response which can be set by the replica of the data-chip-sequence signal generated by the code generator 43. Depending on the setting, the quadrature-phase-symbol-matched filter 37 despreads the received-spread-spectrum signal as a quadrature-phase component of the data-spread-spectrum channel. These can be either the despread-quadrature-phase-pilot-bit-sequence signal or the quadrature-phase-data-bit-sequence signal.

The in-phase-symbol-matched filter 35 and the quadrature-phase-symbol-matched filter 37 are ultimately controlled by the controller 46. The controller 46 controls timing and determines at desired timings when the code generator 43 sets the symbol-impulse responses of the in-phase-symbol-matched filter 35 and the quadrature-phase-symbol-matched filter 37 to the data-chip-sequence signal.

As shown in FIG. 2, the controller 46 controls the in-phase signal register 51 and the quadrature-phase signal register 52, which correspond to the in-phase-symbol-matched filter 35 and the quadrature-phase-symbol-matched filter 37, respectively.

In FIG. 1, the Costas loop 36 uses the output from the in-phase-symbol-matched filter 35 and the output of the quadrature-phase-symbol-matched filter 37 to generate the cosine and sine signals for in-phase mixer 31 and quadrature-phase mixer 32, respectively.

When the-in-phase-symbol-matched filter 35 and quadrature-phase-symbol-matched filter 37 have their respective symbol-impulse responses matched to the pilot-bit-sequence signal, then the output is a despread-header-sequence signal. The despread-header-bit-sequence signal is passed through in-phase-frame-matched filter 38 and quadrature-phase-frame-matched filter 39, respectively. The in-phase-frame-matched filter 38 has an in-phase-frame-impulse response matched to the in-phase component of the pilot-bit-sequence signal, and accordingly, generates an in-phase-peak-pilot-correlation signal when the in-phase component of the despread-pilot-bit-sequence signal matches the in-phase-frame-impulse response. Similarly, the quadrature-phase-frame-matched filter 39 has a quadrature-phase-frame-impulse response matched to a quadrature-phase component of the pilot-bit-sequence signal. When the despread pilot-bit-sequence signal from the quadrature-phase-symbol-matched filter 37 matches the quadrature-phase-frame-impulse response of the quadrature-phase-matched filter 37, then the quadrature-phase-frame-matched filter outputs a quadrature-phase-peak-pilot-correlation signal. The in-phase-peak-pilot-correlation signal and the quadrature-phase-peak-pilot-correlation signal are demodulated by demodulator 41, and can be used as a initial timing signal for controlling when the diversity combiner 42 combines the output from the demodulator 41 for the respective signals from in-phase-symbol-matched filter 35 and the quadrature-phase-symbol-matched filter 37.

Additionally, the in-phase-peak-pilot-correlation signal and the quadrature-phase-peak-pilot-correlation signal can be processed by frame processor 40 to trigger a timing signal to controller 46 which actuates the timing for when a respective in-phase-symbol-impulse response and the quadrature-phase-symbol-impulse response of the in-phase-symbol-matched filter 35 and the quadrature-phase-symbol-matched filter 37, respectively are matched to the data-chip-sequence signal.

In a particular implementation of the present invention, the in-phase-symbol-matched filter 35 and the quadrature-phase-symbol-matched filter 37 have their respective in-phase-symbol-impulse response and quadrature-phase-symbol-impulse response staggered, under the control of the controller 46, such that they are matched to the I and Q to the data-chip-sequence signals every five microseconds. Accordingly, each of the in-phase-symbol-matched filter 35 and the quadrature-phase-symbol-matched filter 37 can have their respective in-phase-symbol-impulse response and quadrature-phase-symbol-impulse response loaded within five microseconds. Typically, current designs have these respective symbol-matched filters loaded within 2.5 microseconds, for a system operating at 100 MHz, with each of the in-phase-symbol-matched filter 35 and the quadrature-phase-symbol-matched filter 37 having a 256 or 64 for chip stage shift register.

The demodulator 41 can be implemented using coherent demodulation, or alternatively noncoherent demodulation.

The diversity combiner 42 combines in a variety of ways, such as maximum likelihood, straight combining, addition, or the demodulated outputs from the in-phase-symbol-matched filter 35 and the quadrature-phase-symbol-matched filter 37 as demodulated through demodulator 41.

FIG. 2 illustrates the matched filter using the time sharing of the multiplier array and adder tree. Shown in FIG. 2 are in-phase-signal register 51, quadrature-phase-signal register 52, multiplexer 57, reference-signal register 53, multiplier array 54, adder tree 55, data register 56, and controller 46. As shown, the dotted lines indicate that the controller 46 provides the necessary controlling of the in-phase-signal register 51, the quadrature-phase-signal register 52, the reference-signal reference 53 and the data register 56. The solid lines indicate the signal flow from the in-phase-signal register 51, the quadrature-phase-signal register 52, the reference-signal register 53 through multiplexer 57. The in-phase-signal register 51 and the quadrature-phase-signal register 52 are coupled through multiplexer 57 to multiplier array 54 to adder tree 55 to data register 56. The data register 56 has the in-phase output and quadrature-phase output.

Figure 5:
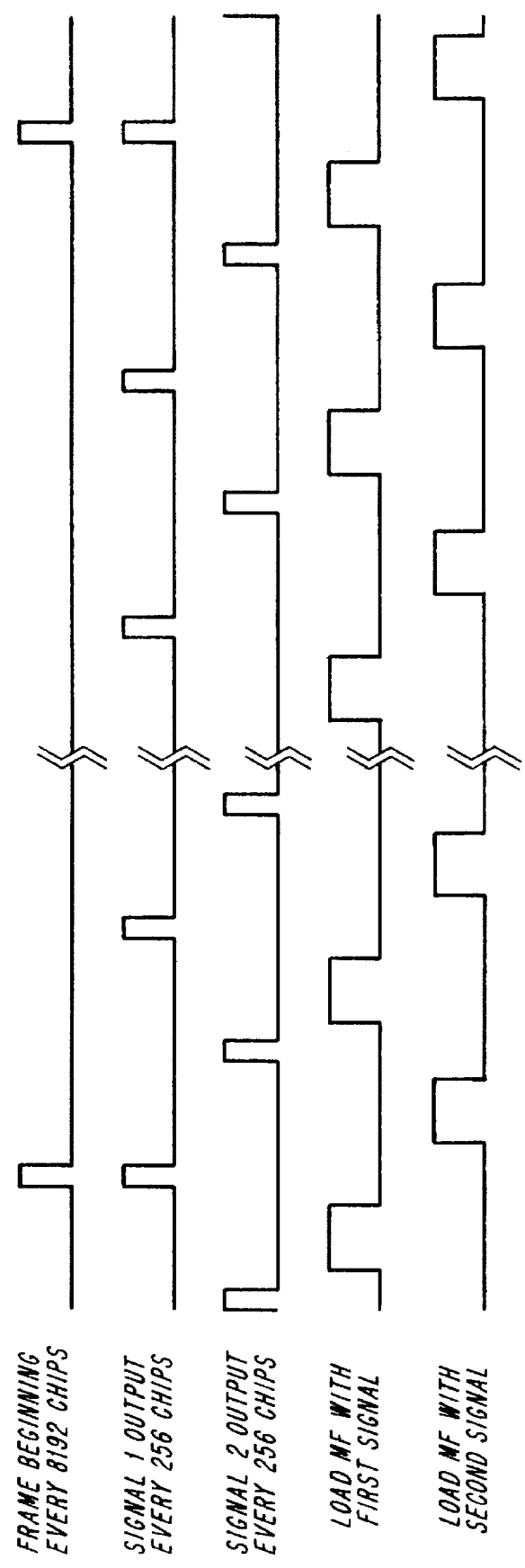
FIG. 5 shows possible timing of signal-time-sharing, matched-filter-based demodulator.

For either embodiment, the header or pilot channel, FIG. 5 illustrates block timing of the signal sharing, matched-filter-based correlator. As shown, a frame can begin every 8192 chips and a first signal, such as the header-bit-sequence signal can be output from the code generator 43 every 256 or 64 chips. Similarly, a second signal, such as a data-chip-sequence signal can be output every 256 chips, but staggered from the first signal, i.e., the pilot signal. Thus, the in-phase-symbol-matched filter 35 and the quadrature-phase-symbol-matched filter 37 are loaded with the first signal, the header or the pilot-chip-sequence signal, and then staggered and loaded with the second signal, the data-chip-sequence signal. The first signal would represent loading the respective matched filters with the header or the pilot-chip-sequence signal and the second signal would be the timing for loading the respective matched filters with the data-chip-sequence signal.

The present invention also includes a method which uses a symbol-matched filter and a frame-matched filter with a spread-spectrum receiver on a received-spread-spectrum signal. As with the apparatus previously disclosed, the received-spread-spectrum signal is assumed to have a data-spread-spectrum channel. The pilot-spread-spectrum channel is generated from spread-spectrum processing a pilot-bit-sequence signal with a pilot-chip-sequence signal. The data-spread-spectrum channel is generated from spread-spectrum processing a data-bit-sequence signal with a data-chip-sequence signal.

The method comprises the steps of generating a replica of the data-chip-sequence signal. In response to the currents of a peak-header correlation signal, at an appropriate delay, the method generates a pilot-control signal. In response to the pilot-control signal, the method programs the symbol-matched filter with the replica of the pilot-bit-sequence signal to set the symbol-matched filter to have a symbol-impulse response matched to the pilot-bit-sequence signal. With the symbol-matched filter matched to the pilot-chip-sequence signal, the method despreads the data-spread-spectrum channel from the received-spread-spectrum signal as a despread pilot-bit-sequence signal.

The frame-matched filter has a frame-impulse response matched to the pilot-bit-sequence signal. The method therefore uses the frame-matched filter to filter the despread pilot-bit-sequence signal. The method thereafter generates from the filtered despread-data-bit-sequence signal, the peak-pilot-correlation signal in response to the despread-pilot-bit-sequence signal matching the frame-impulse response of the frame-matched filter.

The method also generates at a time delay from the pilot-control signal, and in response to the peak-pilot-correlation signal, a data-control signal. In response to the data-control signal, the method programs the symbol-matched filter with the replica of the data-chip-sequence signal so that the symbol-matched filter has the symbol-impulse response matched to the data-chip-sequence signal. The method thereby despreads, while the symbol-matched filter is matched to the data-chip-sequence signal, the data-spread-spectrum channel from the received-spread-spectrum signal as a despread-data-bit-sequence signal.

The method as described herein may be extended to in-phase and quadrature-phase components of a received-spread-spectrum signal. As such, the method would have the step of despreading the pilot-spread-spectrum channel from the received-spread-spectrum signal including the steps of despreading, from the received-spread-spectrum signal, the in-phase component of the pilot-spread-spectrum channel from the received-spread-spectrum signal including the steps of despreading, from the received-spread-spectrum signal, the in-phase component of the pilot-spread-spectrum channel as a despread in-phase component of the pilot-bit-sequence signal, and despreading, from the received-spread-spectrum signal, the quadrature-phase component of the pilot-spread-spectrum channel as a despread-quadrature-phase component of the pilot-bit-sequence signal.

Similarly, the in-phase component and the quadrature-phase component of the received-spread-spectrum signal can be despread as in-phase components and quadrature-phase components of the data-spread-spectrum channel. Accordingly, the method would include despreading, from the received-spread-spectrum signal, an in-phase component of the data-spread-spectrum channel as a despread-in-phase component of the despread-data-bit-sequence signal. The method would also include despreading, a quadrature-phase component of the data-spread-spectrum channel as a despread-quadrature-phase component of the despread-data-bit-sequence signal.

When filtering the despread data-bit-sequence signal into in-phase components and quadrature-phase components of the despread-data-bit-sequence signal, the method can also include generating an in-phase-peak-data-correlation signal and a quadrature-phase-peak-data-correlation signal, in response to the in-phase component and the quadrature-phase component of the despread header-bit-sequence signal matching the in-phase-frame-impulse response and the quadrature-phase-frame-impulse response, respectively.

Matched Filter Operation

In operation, for both embodiments, header and pilot channel, the in-phase-symbol-matched filter 35 and the quadrature-phase-symbol-matched filter 37, by timing signals shown in FIG. 5 from the controller, are loaded with M local sequence symbols, i.e., the replica of the chip-sequence signal. The incoming received-spread-spectrum-signal samples generated by in-phase-analog-to-digital converter 33 and quadrature-phase-analog-to-digital converter 34, respectively, slide by, i.e. are correlated against, the local replicas until they line up, at which time a large information bearing output is produced. The generation of this large output does not require that a synchronization process be successfully completed a priori or that additional circuits dedicated to the acquisition process be employed and it achieves code synchronization in the shortest possible time to acquire the incoming spreading chip-sequence signal. This has the advantage of lower implementation cost, lower physical volume, reduced power consumption, more rapid implementation and much better performance as measured by the time required to achieve code synchronization.

The presence of a strong signal level output indicates that at that specific moment in time M incoming signal symbols and the M symbols of the local spreading code, i.e., chip-sequence signal, loaded in the in-phase-symbol-matched filter 35 and the quadrature-phase-symbol-matched filter 37 are in alignment. The requirement exists that the in-phase-symbol-matched filter 35 and the quadrature-phase-symbol-matched filter 37 be fully loaded with the next M symbols of the local spreading code, i.e., the chip-sequence signal, at any time prior to the arrival of the next M incoming signal symbols at the in-phase-symbol-matched filter 35 and the quadrature-phase-symbol-matched filter 37. The value of the number M, which denotes the size of the respective symbol-matched filter as measured in number of signal samples, is much larger than any value on the order of one; in an example embodiment, M is on the order of 256. Because M is much larger than one of the circuits required to implement the code, phase synchronization functions are much easier to design and implement. This has the advantage of lower implementation cost, lower physical volume, reduced power consumption, more rapid implementation and inherently better performance.

The in-phase-symbol-matched filter 35 and the quadrature-phase-programmable filter 37 identify, characterize and extract the information which arrives through all available channels, or paths, intrinsically, without any additional and parallel signal processing paths. The spreading code loaded as a local reference in the in-phase-symbol-matched filter 35 and the quadrature-phase-symbol-matched filter 37 remain in place until all propagation channels have the opportunity to deliver the information signal at the in-phase-symbol-matched filter 35 and the quadrature-phase-symbol-matched filter 37; the matched filter can then easily recover all $L=T_M(W+1)$ signals it is capable of receiving. As the input signals are offset in time due to differences in length of the propagation path, and since the in-phase-symbol-matched filter 35 and the quadrature-phase-symbol-matched filter 37 are linear devices, the outputs due to the signals' propagation through different channels are output by the in-phase-symbol-matched filter 35 and the quadrature-phase-symbol-matched filter 37 offset in time. Thus the reception and separation of the signals propagating through different channels does not require any additional circuits and the individual signals, which are now separate in time, can be easily individually manipulated and combined in optimum ways such that the matched filter receiver attains the performance of an L-diversity system.

A receiver capable of identifying, separating and combining large numbers (L) of signal replicas propagating through different channels is a time diversity receiver and is commonly called a RAKE receiver. The RAKE receiver structure can be implemented using the matched filter without the excessive complexity incurred by alternative system implementations. The in-phase-symbol-matched filter 35 and the quadrature-phase-symbol-matched filter 37 implementation of the heart of the diversity processing system has the advantage of lower implementation cost, lower physical volume, reduced power consumption, more rapid implementation, less complex control and better performance.

In contrast, the programmable-matched-filter-based demodulator as described herein utilizes only one such set of circuits and, using information which is intrinsically generated, can then coherently demodulate any number of signal replicas that arrive via separate propagation paths. The mechanism by which this is accomplished is to employ one conventional phase tracking circuit, e.g., phase-locked loop (PLLs), Costas loop, or $n^{th}$ power loop, in order to establish a temporarily stable phase reference and to then extract the phase offset of each individual signal with respect to that phase reference. The incoming signal is first downconverted noncoherently to some frequency, including the 0 Hz frequency (DC). Then the in-phase and quadrature-phase channel outputs are read from the in-phase-symbol-matched filter 35 and the quadrature-phase-symbol-matched filter 37, respectively. The phase offset of the carrier signal is contained in the relative amplitudes of the in-phase and quadrature-phase outputs which are then used directly to demodulate the received data signal. Alternatively the phase estimate on the individual propagation paths can be improved by further matched filtering to demodulate the signal with performance equal to or better than that obtained using conventional coherent demodulators but without the added complexity introduced by conventional coherent demodulators. Therefore the symbol-matched filter-based implementation has the advantage of much lower complexity, lower implementation cost, lower physical volume, reduced power consumption, more rapid implementation and better performance.

A set of multipliers and the associated adder tree may be eliminated. By inputting the signals at the input of the remaining set of multipliers and the associated adder tree from two multiplexers, each multiplexer may serve to connect to the multiplier/adder tree structure either the in-phase or quadrature-phase signal registers. This implementation adds the complexity of two multiplexers and reduces the complexity associated with a set of multipliers and an adder tree for a significant net reduction in complexity.

The symbol-matched filter is a digital signal processor, the output of which is of interest only at that instant in time when the portion of interest of the incoming signal is fully loaded and is of no interest at any other time. In the present implementation the size of the symbol-matched filters is approximately 64 or 256 stages, requiring 64 or 256 clock cycles, respectively, to load the input samples of the received-spread-spectrum signal. The output of the symbol-matched filter is of interest only for one or two clock cycles and is of no interest for the rest of the approximately 248 clock cycles. Thus the circuit can be reused during these 248 clock cycles. Two or more signals, say N signals, can utilize the same matched filter provided that the signals are not lined up in phase and thus the outputs are staggered in time. If N=5 signals shared the same matched filter, then the signals could then be staggered by approximately 45 clock cycles and the matched filter could be operated in a number of ways, including the following manner:

1. Starting at clock cycle 5, the symbol-matched filters are loaded with the reference corresponding to the first signal. The output due to the first signal will occur during the 50$^{th}$ and 51$^{st}$ clock cycle.

2. Starting at clock cycle 55, the symbol-matched filters are loaded with the reference corresponding to the second signal. The output due to the second signal will occur during the 100$^{th}$ and 101$^{st}$ clock cycle.

3. Starting at clock cycle 105, the symbol-matched filters are loaded with the reference corresponding to the third signal. The output to the third signal will occur during the 150$^{th}$ and 151$^{st}$ clock cycle.

4. Starting at clock cycle 155, the symbol-matched filters are loaded with the reference corresponding to the fourth signal. The output due to the fourth signal will occur during the 200$^{th}$ and 201$^{st}$ clock cycle.

5. Starting at clock cycle 205, the symbol-matched filters are loaded with the reference corresponding to the fifth signal. The output due to the fifth signal will occur during the 250$^{th}$ and 251$^{st}$ clock cycle.

The cycle then repeats itself for the next output due to the first, second, third, fourth and fifth signals using only one matched filter. The complexity of and size of implementation is reduced by 80% while the signal processing benefits remain constant.

Matched Filter With Low Silicon Requirement

A spread-spectrum-matched filter, which can be used for the symbol-matched filter, which has a low silicon and power requirement, includes reference means, control means, multiplexer means, data register means, multiplying means, summing means, memory means and adder means. The multiplexer means is coupled to the reference means and to the control means. The data register means is coupled to the spread-spectrum receiver. The multiplying means is coupled to the data register means and through the multiplexer means to the reference means. The summing means is coupled between the multiplying means and the memory means. The adder means is coupled to the summing means and the memory means.

The reference means stores a plurality of portions of a reference-chip-sequence signal. The number N is used herein to indicate the number of chips per bit, and P is used herein to indicate the number of portions in the plurality of portions of the reference-chip-sequence signal. For P=2, where there are two portions, for example, then the reference means stores two halves of the reference-chip-sequence signal. For N=512 chips per bit, and P=2 portions, there are 256 chips per each half of the reference-chip-sequence signal. P can be 2 or 4 or more. The choice of P is a trade off between the gates, memory and clock speed.

The control means generates control signals using the clock signal for timing reference. The clock signal has a clock rate at the chip rate, with a corresponding clock cycle. The control signals provides timing to the reference means, multiplexer means, data register means, multiplying means, summing means and adder means.

The multiplexer means outputs sequentially from the reference means each portion of the plurality of portions of the reference-chip-sequence signal during a respective portion of the clock cycle. For two reference-chip-sequence signals, P=2, the multiplexer means outputs a first portion of the reference-chip-sequence signal during the first portion of the clock cycle, then a second portion of the reference-chip-sequence signal during a second portion of the clock cycle.

The data register means shifts a plurality of input-data samples from the spread-spectrum receiver, of the received spread-spectrum signal at the clock rate. Typically, the input-data samples correspond to chips of the spread-spectrum signal, thus, the data register means shifts the plurality of input-data samples at a chip portion of the clock rate. The input-data samples, in a preferred embodiment, are each quantized into one of L quantization levels, which, for L=16 are defined herein to correspond to four quantization bits. The four quantization bits per chip are processed using XOR gates, etc. The L quantization levels result from the N bits/sample analog-to-digital conversion (L=2$^N$), which is employed, and from the noise added to the chips, in the communications channel.

In response to the multiplexer means selecting during each portion of the clock cycle a respective portion of the reference-chip-sequence signal, the multiplying means multiplies the respective portion of the reference-chip-sequence signal by the plurality of input-data samples. Each chip corresponds to one of the plurality of input-data samples, and is represented by four quantization bits. For a plurality of input-data samples located within the register data means for a given clock cycle, at the output of the multiplying means is a plurality of product-output signals. The number M is used herein to indicate the number of product-output signals in the plurality of product-output signals.

The summing means, for each plurality of the product-output signals, sums each of the product-output signals within the plurality of product-output signals, during a respective portion of the clock cycle and thereby generates a sum. Thus, for a number of clock cycles, i.e., a plurality of clock cycles, the output of the summing means is a plurality of sums. The summing means sums each plurality of product-output signals with the corresponding portion of the plurality of the reference-chip-sequence signal.

The memory means stores at least M sums of the plurality of M sums from the summing means. All M sums could be stored in memory means. The adder means adds the plurality of sums and outputs the output signal from the matched filter.

Figure 6:
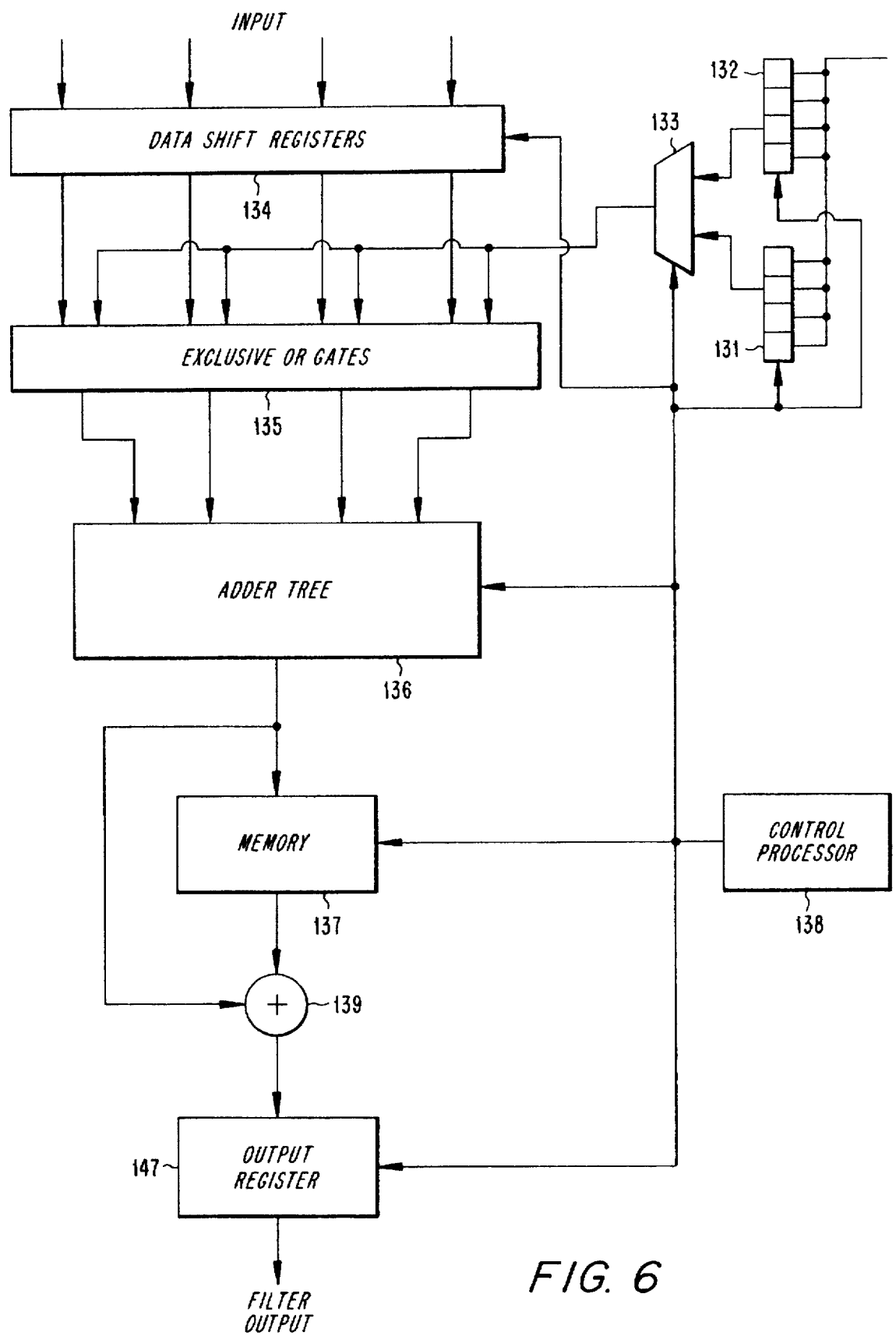
FIG. 6 is a block diagram of an embodiment of the matched filter of the present invention.

The exemplary arrangement shown in FIG. 6 is for P=2 reference-chip-sequence signals, used for two portions or halves of the reference-chip-sequence signal. For the embodiment shown in FIG. 6, the reference means includes a first plurality of shift registers 131 and a second plurality of shift registers 132. The control means is embodied as a control processor 138, the multiplexer means is embodied as a multiplexer 133 and the data register means is embodied as a plurality of data-shift registers 134. In a preferred embodiment, the plurality of data-shift registers 134 store each chip as a sample, and each chip is quantized into one of 16 levels. Thus, the plurality data-shift registers 134 stores four quantization bits per chip. The 16 quantization levels are the result of the input analog-to-digital converter employing four quantization bits to represent each sample, i.e., four quantization bits per chip. Distinguish the quantization bit from the information bit. The information bit is represented by an entire chip sequence, for example, 256 chips per information bit. The four quantization bits are used for quantizing the amplitude of each chip.

The multiplying means is shown as a plurality of exclusive-OR (XOR) gates 135, and the summing means is embodied as an adder tree 136. The adder tree may include a plurality of adder gates coupled to the plurality of XOR gates. The memory means is shown as a memory 137 and the adder means is shown as an adder 139.

The multiplexer 133 is coupled to the first plurality of shift registers 131, and to the second plurality of shift registers 132. The control processor 138 is coupled to the first plurality of shift registers 131, the second plurality of shift registers 132, the multiplexer 133, the plurality of data-shift registers 134, the adder tree 136, the memory 137, and the output register 147. The control means generates control signals using the clock signal for timing reference. The clock signal has a clock rate at the chip rate, with a corresponding clock cycle. The control signals provides timing to the reference means, multiplexer means, data register means, multiplying means, summing means and adder means.

The plurality of data-shift registers 134 is coupled to the spread-spectrum receiver. The plurality of XOR gates 135 is coupled to the plurality of data-shift registers 134 and through the multiplexer 133 to the first plurality of shift registers 131, and through the multiplexer 133 to the second plurality of shift registers 132. The adder tree 136 is coupled to the plurality of XOR gates 135, the memory 137 is coupled to the adder tree 136, and the adder 139 is coupled to the adder tree 136 and to the output of the memory 137. An output register 147 is coupled to the adder 139.

The first plurality of shift registers 131 stores a first portion of the reference-chip-sequence signal, and the second plurality of shift registers 132 stores a second portion of the reference-chip-sequence signal. In response to the clock signal and during the first portion of the clock cycle, the multiplexer 133 outputs, from the first plurality of shift registers 131 through the multiplexer 133, the first portion of the reference-chip-sequence signal during a first portion of the clock cycle. In response to the clock cycle during the second portion of the clock cycle, the multiplexer 133 outputs from the second plurality of shift register 132, the second portion of the reference-chip-sequence signal during the second portion of the clock cycle.

The plurality of data-shift registers 134 shifts the plurality, of input-data samples of the received spread-spectrum signal at the clock rate. Typically, the plurality of data-shift registers 134 stores the input-data samples at the chip rate and there are, by way of example, four storage data shift registers for one chip. The plurality of data-shift registers 134 may include having a number of shift registers per sample, and therefore there may be, by way of example, four shift registers for storing the input-data sample of the received spread-spectrum signal. The four storage data shift registers store the four quantization bits, generated from an analog-to-digital converter. The analog-to-digital converter samples at the chip rate, and generates an input-data sample for each chip. Preferably, the input data sample has one of 16 quantization levels. The analog-to-digital converter converts each of the 16 quantization levels into four quantization bits. As is well known in the art, four binary levels, i.e., four quantization bits, can represent the 16 quantization levels.

When the multiplexer 133 selects the first plurality of shift-registers 131 during the first portion of the clock cycle, the plurality of XOR gates 135 multiplies the first portion of the reference-chip-sequence signal by the plurality of input-data samples stored in the data-shift registers 134 during the first portion of the clock cycle. At the end of this multiplication, the plurality of XOR gates 135 output a first plurality of product-output signals.

When the multiplexer 133 selects the second plurality of shift registers 132 during the second portion of the clock cycle, the plurality of XOR gates 135 multiply the second portion of the reference-chip-sequence signal by the plurality of input-data samples stored in the data-shift registers 134 during the second portion of the clock cycle. At the output of the plurality of XOR gates 135 during this multiplication is a second plurality of product-output signals.

The adder tree 136 typically includes a plurality of adder gates coupled to the plurality of XOR gates 135. The plurality of adder gates serves to sum the output from the plurality of XOR gates 135. Thus, during the first portion of the clock cycle, the adder tree 136 sums the first plurality of product-output signals thereby generating a first sum. Subsequently, during the second portion of the clock cycle, the adder tree 136 sums the second plurality of product-output signals thereby generating the second sum.

The memory 137 stores the first sum outputted from the adder tree 136 during the first portion of the clock cycle. At the end of the second clock cycle, the first sum is stored in the memory 137 and the second sum is present at the output of the adder tree 136. The adder 139 adds the first sum stored in the memory 137 to the second sum from the adder tree 136. The output signal from adder 139 is stored in output register 147 for aligning the output signal with the clock signal.

The present invention may further include having an AND gate coupled to the control processor, for inhibiting the clock signal to the reference means. Alternatively, the present invention may include an AND gate coupled to the reference means for inhibiting operation of the data inputs to the reference means. By using the AND gate for inhibiting the reference means, the present invention requires less power by not having the shift registers operate during down time.

Figure 7:
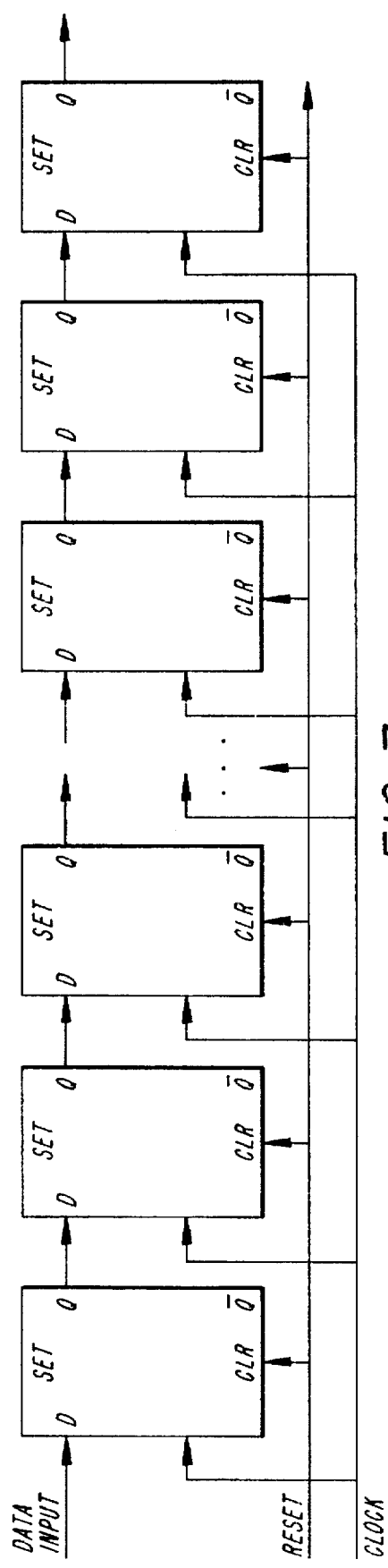
FIG. 7 is a block diagram of a shift register without power management feature.
Figure 8:
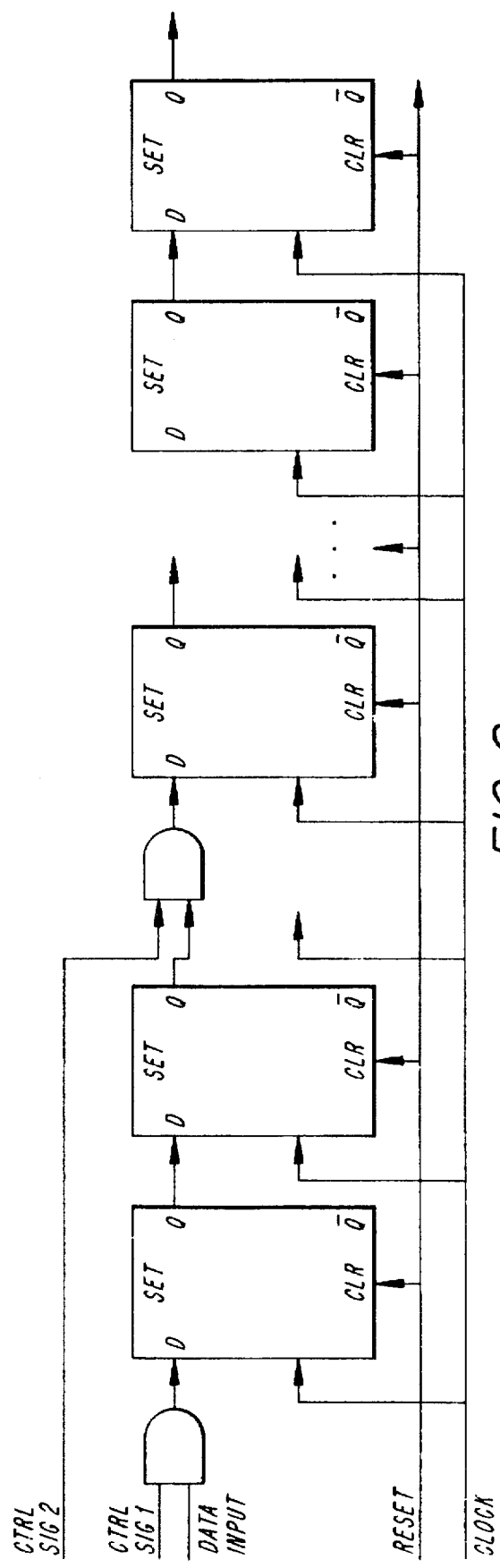
FIG. 8 is a block diagram of a shift register with power management feature at the data input.

Instead of having the plurality of data-shift registers 134 enabled continuously, as shown in FIG. 7, in order to maximize the power saving of the design, a gate can be added in front of the plurality of data-shift registers 134 as shown in FIG. 8. The gate is controlled by the output of the processing gain function. These gates provide means for completely turning off any section of the symbol-matched filter that is not used according to the processing gain (PG) input.

Figure 9:
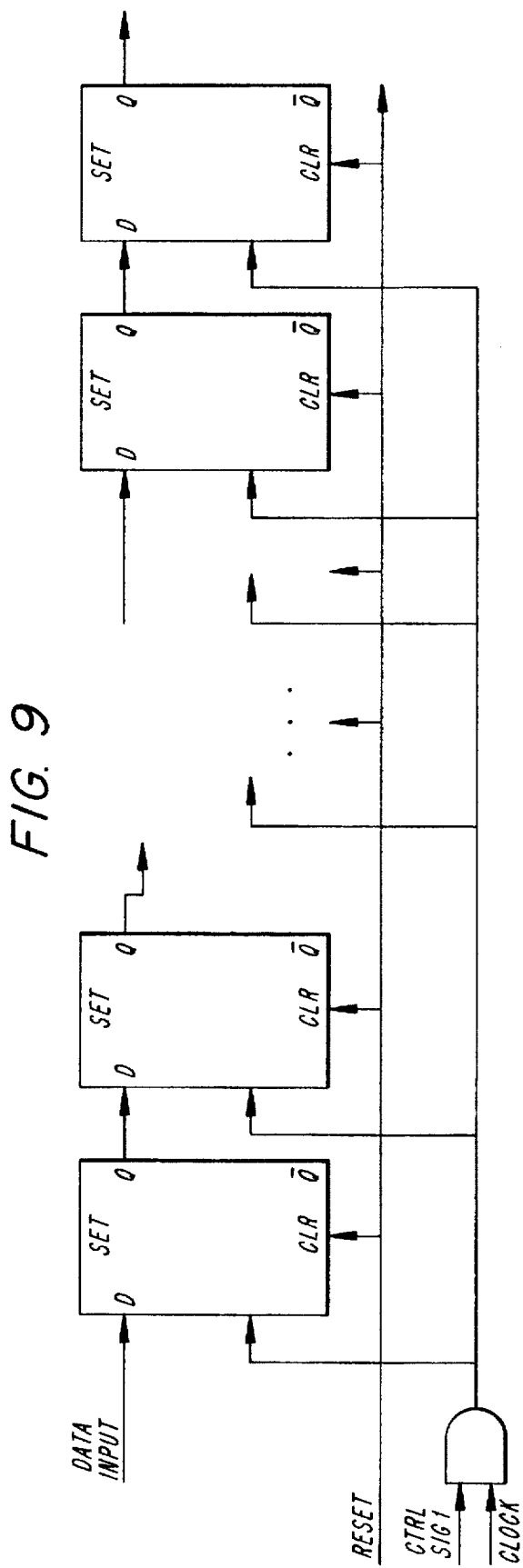
FIG. 9 is a block diagram of a shift register with power management feature at the clock input.

An extra AND gate also may be utilized at the input of each plurality of data-shift registers 134 as shown in FIG. 9. One input of the AND gate is used to disable or enable the whole symbol-matched filter. By setting this control signal to logic "0", the plurality of data-shift registers 134 is disabled. Therefore, no output switching occurs at the output of the plurality of data-shift registers 134 and through out the whole symbol-matched filter, FIG. 9. A variety of logic gates or combination of gates can be used so long as it can perform the same logical function as described above.

This concept can be applied at different locations inside the symbol-matched filter to provide the same result. Instead of disabling the input into the plurality of data-shift registers 134, the control signal can be used as the clock enable line feeding each of the shift registers of the plurality of data shift registers 134 and all the registers in the symbol-matched filter, as shown in FIG. 9. By setting the control signal to logic "0", the clock line feeding the symbol-matched filter is disabled, thus preventing any gate from switching logic levels inside the bit matched filter. Therefore, power utilization can be reduced. This concept provides a great saving of power with a minimum hardware requirement to implement.

As an example, in a communication time division duplex (TDD) application, the whole symbol-matched filter is not used during transmission and RF switching period. The symbol-matched filter is required only during the receiving period, which represents less than 50% of the usage time. Therefore, these gates at the beginning of each shift register bank turn on the symbol-matched filter only during the receiving period following a simple procedure such as:

```
IF Rx cycle = TRUE then
    Set the control bit at one of the AND gate to 1
ELSE
    Set the control bit to "0"
END IF
```

Figure 10:
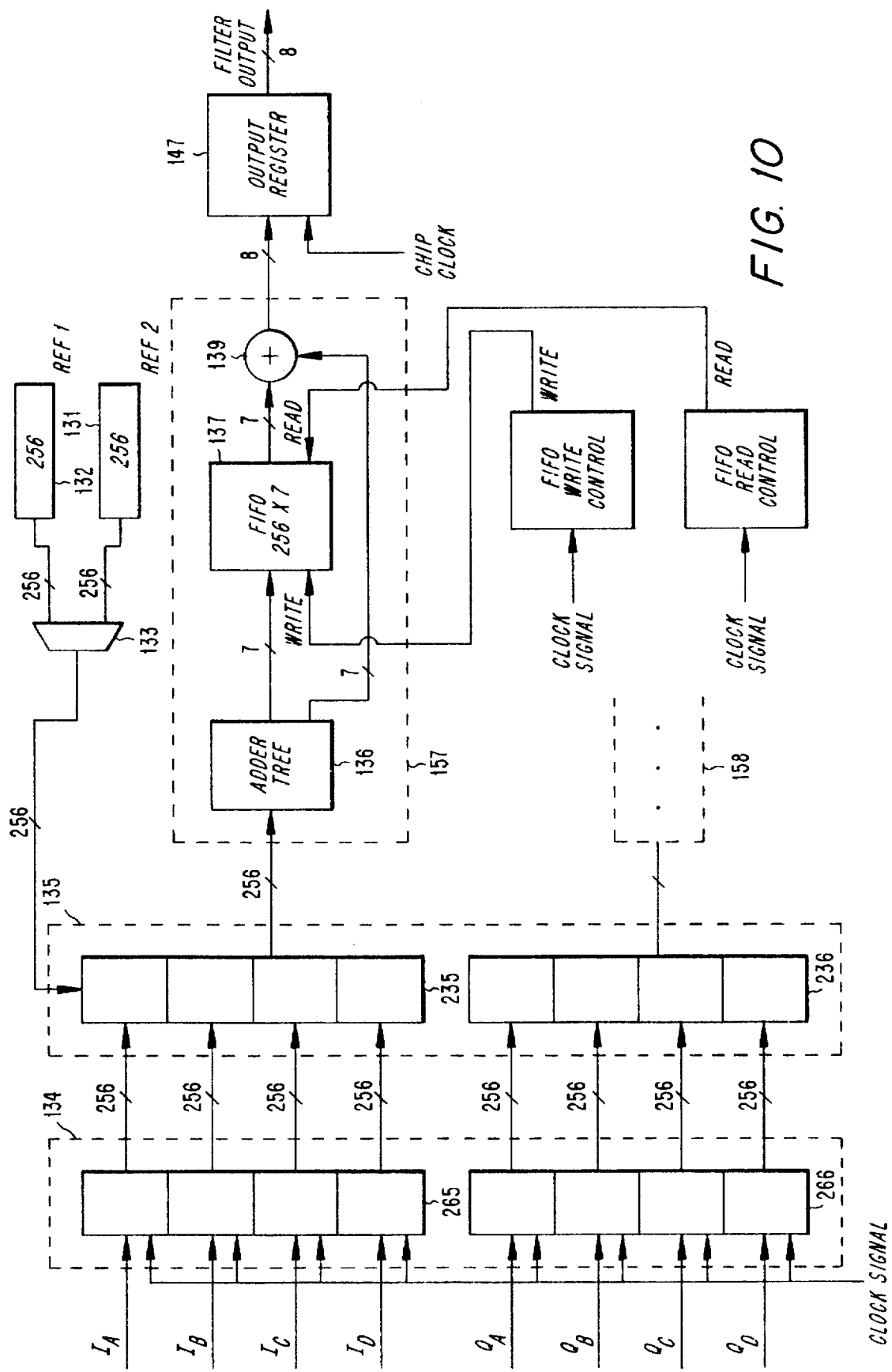
FIG. 10 is a block diagram of the matched filter.

FIGS. 10–15 illustrate an example of the performance of the symbol-matched filter. For this example, the symbol-matched filter of FIG. 10 is assumed to have N=512 samples, with four quantization bits per sample.

Figure 11:
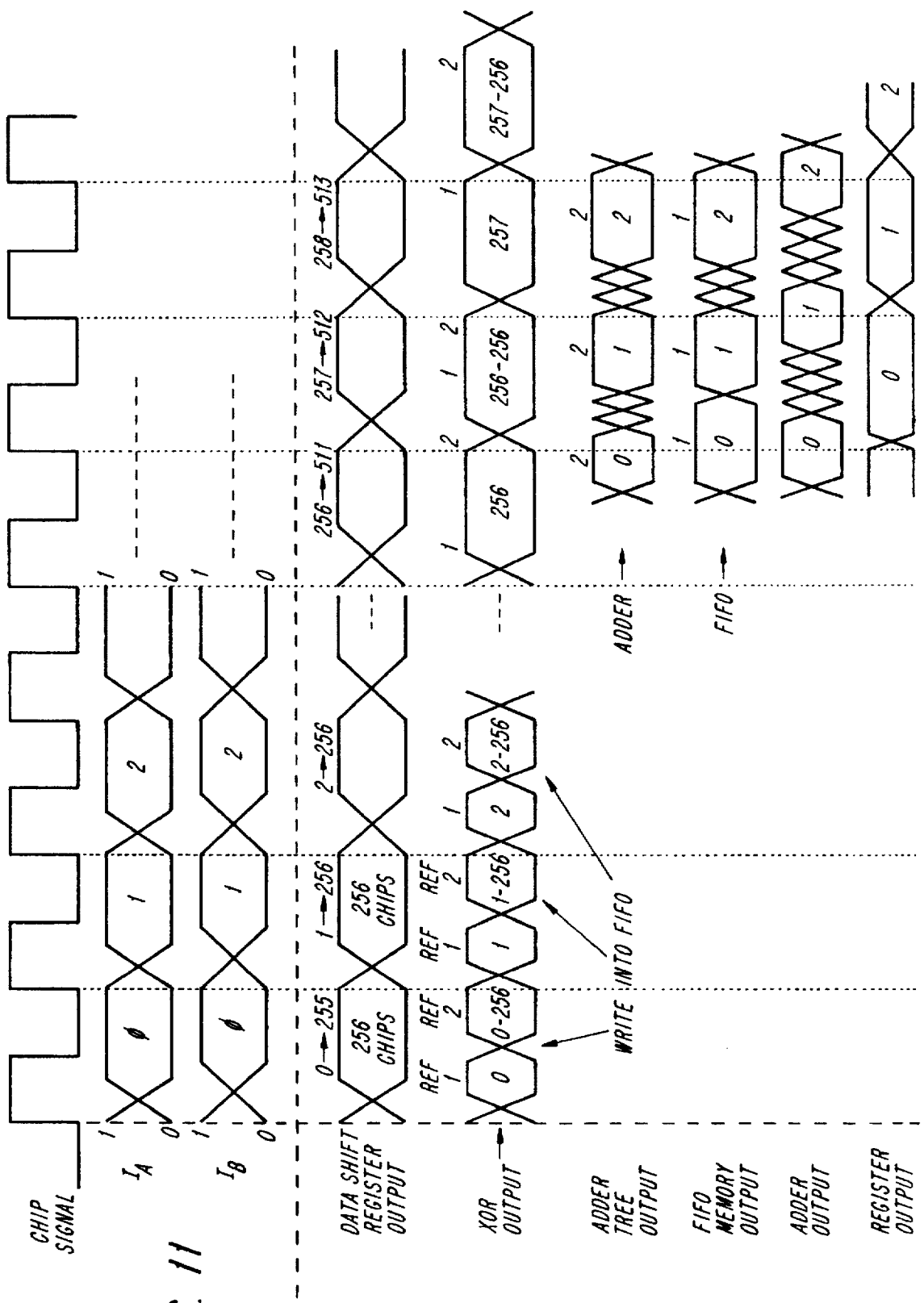
FIG. 11 illustrates timing.

This implementation of the symbol-matched filter requires having P/2 stages of data-shift registers. In this case, a four shift register bank of 256 stages each are used since there are four quantization bits per sample. In-phase input-data samples $I_1$, $I_2$, $I_3$, $I_4$ and quadrature-phase input-data samples $Q_1$, $Q_2$, $Q_3$, $Q_4$ are shifted through the plurality of in-phase data-shift registers 265 and the plurality of quadrature-phase data-shift registers 266, respectively, at the clock rate, and multiplied by the first portion of the reference-chip-sequence signal and the second portion of the reference-chip signal, with the in-phase XOR gates 235 and the quadrature-phase XOR gates 236, respectively. In FIG. 10, four data-shift registers are shown for each of the in-phase input-data samples $I_1$, $I_2$, $I_3$, $I_4$, and for each of the quadrature-phase input-data samples $Q_1$, $Q_2$, $Q_3$, $Q_4$. The clock signal shown in FIG. 11 is a timing basis for this example.

The reference-chip-sequence signal is divided into two halves and stored into two banks of shift registers, the first plurality of shift registers 131 and the second plurality of shift registers 132, of 256 (N/2) registers each. The outputs of the first plurality of shift registers 131 and the second plurality of shift registers 132 from multiplexer 133 may, but need not be, selected by the clock signal. Each half of the reference-chip-sequence signal is available for one half of the clock cycle period.

Figure 16:
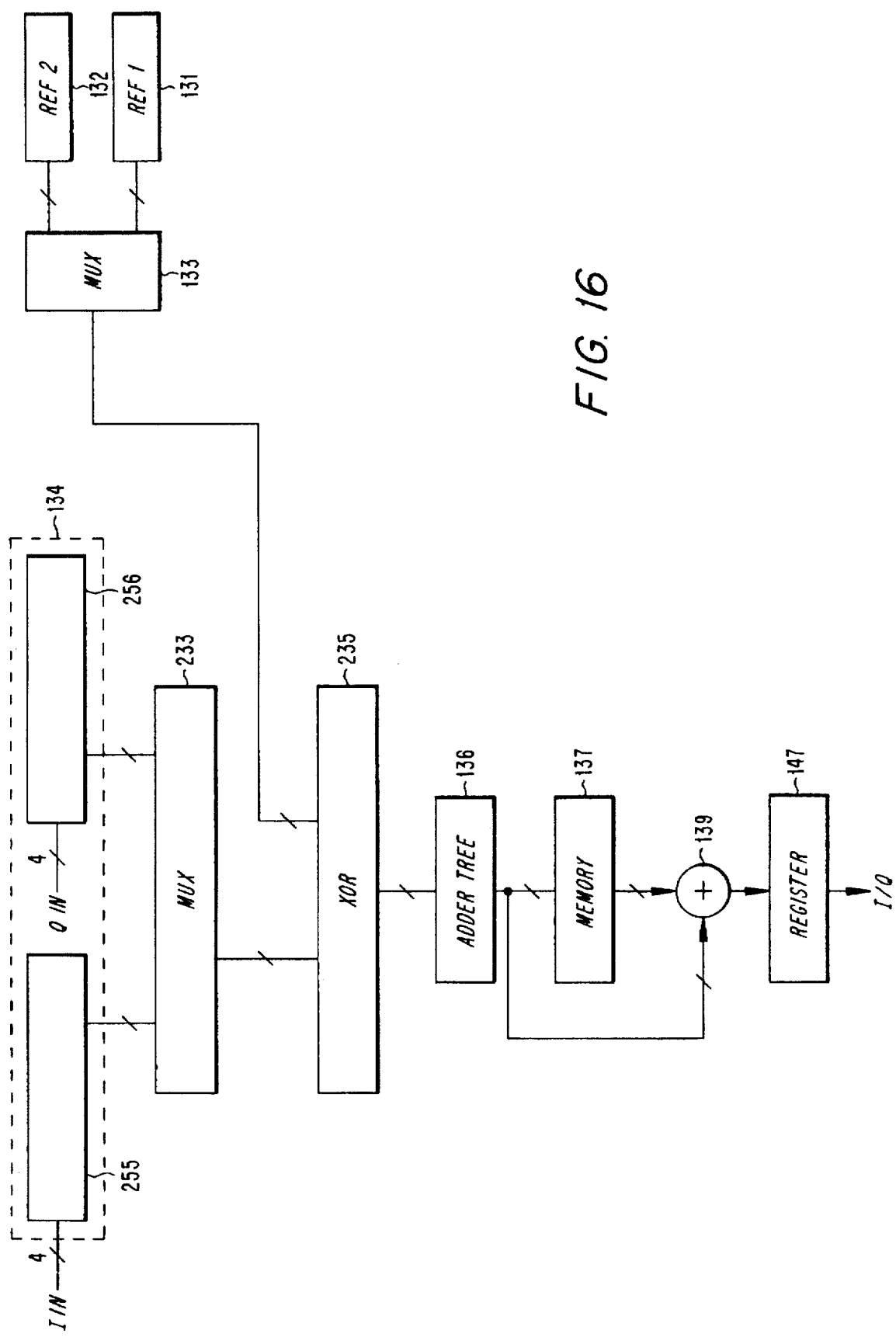
FIG. 16 is a block diagram of an equivalent matched filter of FIG. 10, using time sharing of the adder tree and adder.

A set of XOR gates 135 includes in-phase XOR gates 235 and quadrature-phase XOR gates 236. A chip multiplication function is performed by the in-phase XOR gates 235 between the output of the in-phase-data-shift registers 265 and the plurality of quadrature-phase-data-shift registers 266, and the multiplexer 133 output of the first plurality of shift registers 131, and the second plurality of shift registers 132, respectively, referred to FIG. 10. The in-phase XOR gates 235 feeds an adder tree 136, for the in-phase component. The quadrature-phase XOR gates 236 feeds a quadrature-phase group of elements (not shown) 158 for the quadrature-phase component, similar as used for the in-phase group of elements 157 for the in-phase component. Thus, the quadrature phase portion would be processed in the same manner as the in-phase portion. Alternatively, the in-phase XOR gates 235, the elements which comprise the in-phase group of elements 157, and output register 147, may be time multiplexed, as shown in FIG. 16. A multiplexer 233 is inserted between the in-phase data-shift registers 255 and the quadrature-phase data-shift registers 256, and in-phase XOR gates 235. The multiplexer 233 time shares the processing of the in-phase input-data samples $I_1$, $I_2$, $I_3$, $I_4$ and the quadrature-phase input-data samples $Q_1$, $Q_2$, $Q_3$, $Q_4$ with the XOR gates 135, the group of elements 157 and the output register 147.

For this example, the adder tree 136 comprises: 128 four bit adders, 64 five bit adders, 32 six bit adders, 16 seven bit adders, 8 eight bit adders, 4 nine bit adders, 2 ten bit adders, 1 eleven bit adder. The adder tree 136 is used to perform a summation of all 256 data output from the multiplier bank of XOR gates 135. Multiple pipeline registers levels may be required as determined by the clock rate to meet timing requirements.

In the first half of the clock period, the first plurality of shift registers 131 is selected to correlate with the 256 input samples. The resulting output of the adder tree 136 is stored in the first in first out (FIFO) memory 137, or regular memory, under control of FIFO read controller. The FIFO memory 137 should be at least M/2 memory cells deep with 11 quantization bits per word. Word length is determined by the output of the adder tree 136 or by the designer. FIG. 11 illustrates the timing of two of the in-phase input-data samples $I_A$, $I_B$, the timing of the output of the data shift register 134, and the output of the XOR gates 135 with reference to the clock signal.

In the second half of the same clock period, FIG. 11, the second plurality of shift registers 132 is selected to correlate with the same set of 256 input samples. The resulting output of the adder tree 136 is added to the value stored in the FIFO memory 137, N/2 clock period earlier. The timing of the output of the FIFO memory 137 and the adder tree 136 are shown in FIG. 11, and controlled by FIFO read controller.

This final result gives a correlation result of a full N sample in real time by using only N/2 storage data shift registers of the symbol-matched filter, stored in output register 147.

This architecture can be used for any size N of the symbol-matched filter and the architecture is scaleable.

One can break the symbol-matched filter length into two halves of length N/2 each, as described above. One also can break the symbol-matched filter into four sections of length N/4 each, shown for the third implementation (IMPL3) and sixth implementation (IMPL6) of Table 1 and 2, or eight sections of length N/8 each, or M sections of length N/M each. However, one should consider the trade off among different values of M.

Figure 12:
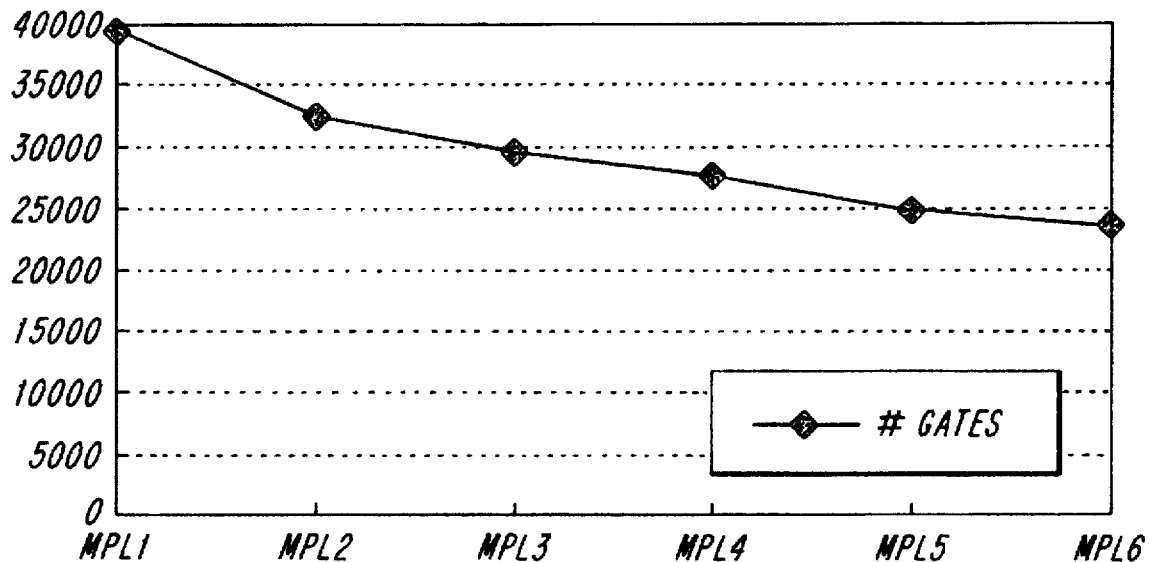
FIG. 12 shows number of gates versus implementation method for a 256 chip matched filter.
Figure 13:
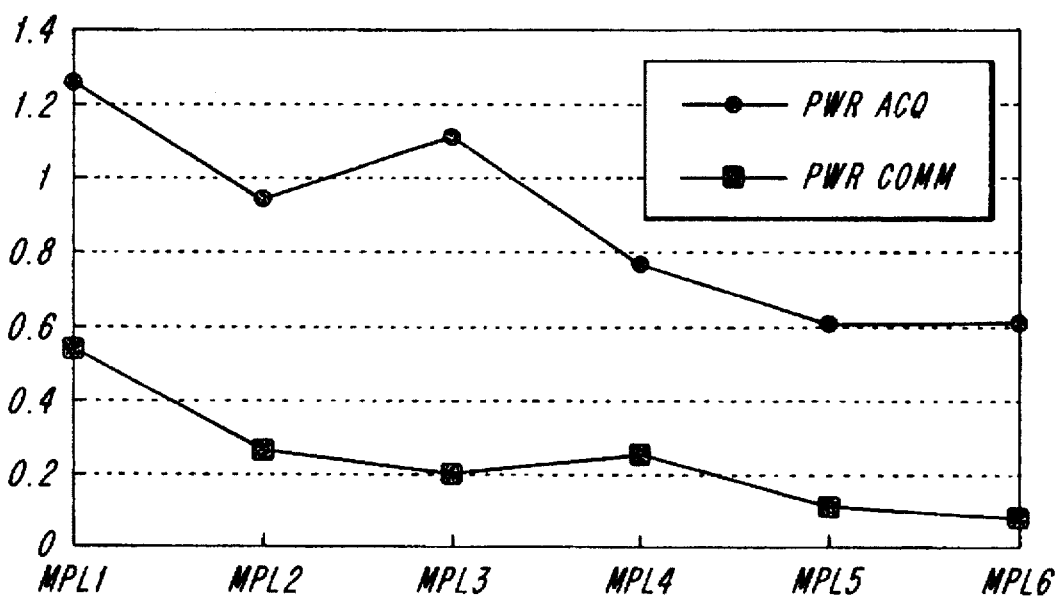
FIG. 13 shows power consumption versus implementation method for the 256 chip matched filter.
Figure 14:
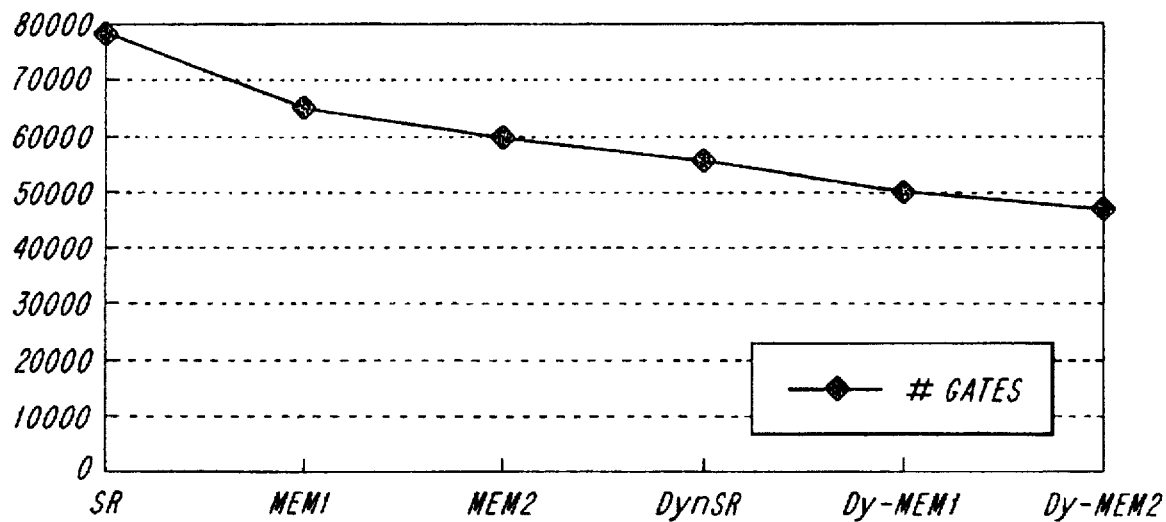
FIG. 14 shows number of gates versus implementation method for a 512 chip matched filter.
Figure 15:
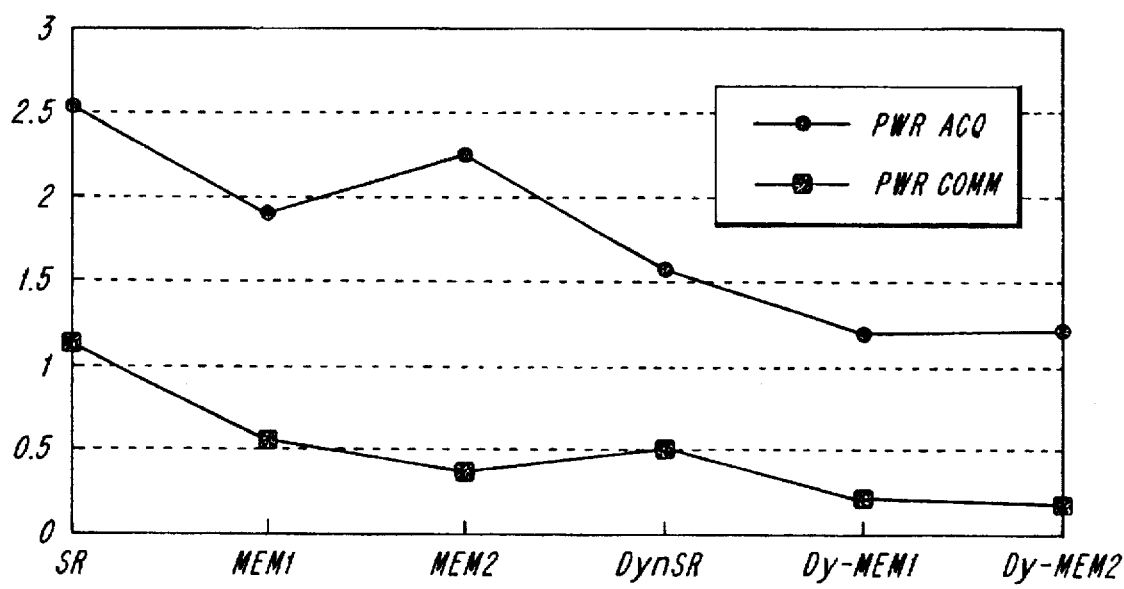
FIG. 15 shows power consumption versus implementation method for the 512 chip matched filter.

This method can save a tremendous amount of power as shown in Table 1 and FIGS. 12–13 for a 256 chip matched filter, and Table 2 and FIGS. 14–15 for a 512 chip matched filter. The example shown in Table 1, uses three levels of registers for pipeline.

TABLE 1

| | FOR 256 CHIP MATCHED FILTER | | | | | |
|---|---|---|---|---|---|---|
| | IMPL1 | IMPL2 | IMPL3 | IMPL4 | IMPL5 | IMPL6 |
| # gates | 39376 | 32080 | 29674 | 24580 | 24580 | 23890 |
| PWR AC | 2.242368 | 1.680192 | 1.886688 | 1.744704 | 1.329964 | 1.377504 |
| PWR CO | 0.687789 | 0.400262 | 0.30479 | 0.572602 | 0.232531 | 0.187517 |

TABLE 2

| FOR 512 CHIP MATCHED FILTER | | | | | | |
|---|---|---|---|---|---|---|
| | IMPL1 | IMPL2 | IMPL3 | IMPL4 | IMPL5 | IMPL6 |
| # gates | 78752 | 64160 | 59348 | 55520 | 49120 | 47380 |
| PWR AC | 4.484736 | 3.360384 | 3.773376 | 3.489408 | 2.659968 | 2.755008 |
| PWR CO | 1.775578 | 0.800525 | 0.809581 | 1.145203 | 0.465062 | 0.375034 |

The total number of gates to implement the above design is calculated and listed in Table 1 as the first through sixth implementation (IMPL1–IMPL6). From Table 1 and FIGS. 12–13, the first implementation IMPL1 refers to the normal method of implementing a symbol-matched filter as described in the background section of this disclosure. The second implementation (IMPL2) and the third implementation (IMPL3) are the result of using this disclosed architecture with N=256 and P=2 and P=4, respectively. Implementation one (IMPL1) uses static flip flops for registers, i.e., gates. Implementation two (IMPL2) is similar to implementation one (IMPL1) with half of the registers, gates, replaced with random access memory (RAM). FIGS. 12–15 illustrates that with a decrease in the number of static flip flops, i.e., gates, there is a decrease in power consumption. Implementation three (IMPL3) employs one-fourth the flip-flops for registers as implementation one (IMPL1), with three-fourths the flip-flops replaced with RAM. Implementation three (IMPL3) has an increase in power consumption relative to the second implementation (IMPL2), but a decrease in the number of gates.

Implementation four (IMPL4), five (IMPL5) and six (IMPL6) are similar to implementation one (IMPL1), two (IMPL2), and three (IMPL3), but with dynamic flip-flops replacing the static flip-flops.

The savings come from various sources and can be summarized as follows.

The present invention uses only half the total number of shift registers and an adder tree of half the previous size. Each register has about seven gates count (ASIC vendor dependent). Therefore, the number of gates saved is about seven gates *(N/2 )*(number of bits per sample)=7*(512/2)* 4=7168 gates.

To share the adder tree 136, existing architecture requires multiplexing two input data; therefore, a large multiplexer circuitry is required. With the present invention, an N/2 2:1 multiplexer 133 is required; a small static random access memory (RAM) of a size of N/2 words by X bits wide, is also required. N represents the filter's length and X is the dynamic range of the adder tree 136 output. In addition to those advantages, the memory 137 consumes no power during stand-by mode.

The symbol-matched filter of 512 chips was implemented in HDL VHDL and simulated in Model Technology VSystem simulation tool. The design was successfully synthesized using a Synopsys Design Compiler Version 3.4a along with LSI Logic lcbg10p technology library.

It will be apparent to those skilled in the art that various modifications can be made to the matched filter of the instant invention without departing from the scope or spirit of the invention, and it is intended that the present invention cover modifications and variations of the matched filter provided they come within the scope of the appended claims and their equivalents.

We claim:

1. A spread-spectrum-matched filter, for use as part of a spread-spectrum receiver on a received-spread-spectrum signal having a plurality of information bits, with the received-spread-spectrum signal generated from spread-spectrum processing each information bit with a chip-sequence signal, comprising:

a first plurality of shift registers for storing a first portion of a reference-chip-sequence signal;

a second plurality of shift registers for storing a second portion of the reference-chip-sequence signal;

a control processor for generating a clock signal having a clock rate with a clock cycle;

a multiplexer, coupled to said first plurality of shift registers and to said second plurality of shift registers, responsive to the clock signal, for outputting, from said first plurality of shift registers through said multiplexer, the first portion of the reference-chip-sequence signal during a first portion of the clock cycle, and for outputting, from said second plurality of shift registers through said multiplexer, the second portion of the reference-chip-sequence signal during a second portion of the clock cycle;

a plurality of data-shift registers, coupled to said spread-spectrum receiver, for shifting a plurality of input-data samples of the received-spread-spectrum signal at the clock rate;

a plurality of exclusive-OR (XOR) gates, coupled to said plurality of data-shift registers and through said multiplexer to said first plurality of shift registers and through said multiplexer to said second plurality of shift registers, responsive to said multiplexer selecting the first plurality of shift registers during the first portion of the clock cycle, for multiplying the first portion of the reference-chip-sequence signal by the plurality of input-data samples during the first portion of the clock cycle, thereby outputting a first plurality of product-output signals, and responsive to said multiplexer selecting the second plurality of shift registers during the second portion of the clock cycle, for multiplying the second portion of the reference-chip-sequence signal by the plurality of input-data samples during the second portion of the clock cycle, thereby outputting a second plurality of product-output signals;

an adder tree, comprising a plurality of adder gates coupled to said plurality of XOR gates, for summing the first plurality of product-output signals during the first portion of the clock cycle, thereby generating a first sum, and for summing the second plurality of product-output signals during the second portion of the clock cycle thereby generating a second sum;

a memory, coupled to said adder tree, for storing the first sum outputted from said adder tree during the first portion of the clock cycle; and an adder, coupled to said adder tree and to said memory, for adding the first sum stored in said memory to the second sum from said adder tree.

2. The spread-spectrum-matched filter as set forth in claim 1, further comprising an AND gate coupled to said control processor for inhibiting the clock signal to said first plurality of shift registers and to said second plurality of shift registers.

3. The spread-spectrum-matched filter as set forth in claim 1, further comprising an AND gate coupled to an input of each shift register of said first plurality of shift registers for inhibiting operation of said first plurality of shift registers.

4. The spread-spectrum-matched filter as set forth in claim 1, further comprising an AND gate coupled to an input of each shift register of said second plurality of shift registers for inhibiting operation of said second plurality of shift registers.

5. A spread-spectrum-matched filter, for use as part of a spread-spectrum receiver on a received-spread-spectrum signal having a plurality of information bits with the received-spread-spectrum signal generated from spread-spectrum processing each information bit with a chip-sequence signal, comprising:

reference means for storing a plurality of portions of a reference-chip-sequence signal;

control means for generating a clock signal having a clock rate with a clock cycle;

multiplexer means, coupled to said reference means and responsive to the clock signal, for outputting, sequentially, from said reference means and through said multiplexer means, each portion of the plurality of portions of the reference-chip-sequence signal during a respective portion of the clock cycle;

data-register means, coupled to said spread-spectrum receiver, for shifting a plurality of input-data samples of the received-spread-spectrum signal at the clock rate;

multiplying means, coupled to said data-register means and through said multiplexer means to said reference means, responsive to said multiplexer means selecting during each portion of the clock cycle, for multiplying the respective portion of the reference-chip-sequence signal by the plurality of input-data samples located in said data-register means during the respective portion of the clock cycle, thereby outputting a respective plurality of product-output signals;

summing means, coupled to said multiplying means, for summing each plurality of product-output signals during the respective portion of the clock cycle, thereby generating a plurality of sums corresponding to the plurality of portions of the reference-chip-sequence signal;

memory means, coupled to said summing means, with N an integer, for storing at least N−1 sums of the plurality of N sums; and adder means, coupled to said summing means and to said memory means, for adding the plurality of sums.

6. The spread-spectrum-matched filter as set forth in claim 5, further comprising an AND gate coupled to said control means for inhibiting the clock signal to said reference means.

7. The spread-spectrum-matched filter as set forth in claim 5, with said reference means including:

a first plurality of shift registers for storing a first portion of a reference-chip-sequence signal; and a second plurality of shift registers for storing a second portion of the reference-chip-sequence signal.

8. The spread-spectrum-matched filter as set forth in claim 7, further comprising an AND gate coupled to said reference means for inhibiting operation of said first plurality of shift registers.

9. The spread-spectrum-matched filter as set forth in claim 8 with said multiplexer means including a multiplexer coupled to said first plurality of shift registers and to said second plurality of shift registers, responsive to the clock signal, for outputting, from said first plurality of shift registers and through said multiplexer, the first portion of the reference-chip-sequence signal during a first portion of the clock cycle, and for outputting, from said second plurality of shift registers and through said multiplexer, the second portion of the reference-chip-sequence signal during a second portion of the clock cycle.

10. The spread-spectrum-matched filter as set forth in claim 9, with said multiplying means including a plurality of exclusive-OR (XOR) gates, coupled to said data register means and through said multiplexer to said first plurality of shift registers and through said multiplexer to said second plurality of shift registers, responsive to the multiplexer selecting the first plurality of shift registers during the first portion of the clock cycle, for multiplying the first portion of the reference-chip-sequence signal by the plurality of input-data samples during the first portion of the clock cycle, thereby outputting a first plurality of product-output signals, and responsive to said multiplexer selecting the second plurality of shift registers during the second portion of the clock cycle, for multiplying the second portion of the reference-chip-sequence signal by the plurality of input-data samples during the second portion of the clock cycle, thereby outputting a second plurality of product-output signals.

11. A spread-spectrum-matched filter, for use as part of a spread-spectrum receiver on a received-spread-spectrum signal having a plurality of information bits with the received-spread-spectrum signal generated from spread-spectrum processing each information bit with a chip-sequence signal, comprising:

first reference means for storing a first portion of a reference-chip-sequence signal;

second reference means or storing a second portion of the reference-chip-sequence signal;

control means for generating a clock signal having a clock rate with a clock cycle;

multiplexer means, coupled to said first reference means and to said second reference means and responsive to the clock signal, for outputting, from said first reference means, through said multiplexer means, the first portion of the reference-chip-sequence signal during a first portion of the clock cycle, and for outputting, from said second reference means, the second portion of the reference-chip-sequence signal during a second portion of the clock cycle;

data-register means, coupled to said spread-spectrum receiver, for shifting a plurality of input-data samples of the received-spread-spectrum signal at the clock rate;

multiplying means, coupled to said data-register means and through said multiplexer means to said first reference means and through said multiplexer means to said second reference means, responsive to said multiplexer means selecting the first reference means during the first portion of the clock cycle, for multiplying the first portion of the reference-chip-sequence signal by the plurality of input-data samples located in said data-register means during the first portion of the clock cycle, thereby outputting a first plurality of product-output signals, and responsive to said multiplexer means selecting the second reference means during the second portion of the clock cycle, or multiplying the second portion of the reference-chip-sequence signal by the plurality of input-data samples located in said data-register means during the second portion of the clock cycle, thereby outputting a second plurality of product-output signals;

adder-tree means coupled to said multiplying means, for summing the first plurality of product-output signals during the first portion of the clock cycle, thereby generating a first sum, and for summing the second plurality of product-output signals during the second portion of the clock cycle thereby generating a second sum;

memory means, coupled to said adder-tree means, for storing the first sum; and adder means, coupled to said adder-tree means and to said memory means, for adding the first sum stored in said memory means to the second sum from said adder tree.

12. The spread-spectrum-matched filter as set forth in claim 11, further comprising an AND gate coupled to said control means for inhibiting the clock signal to said first reference means and to said second reference means.

13. The spread-spectrum-matched filter as set forth in claim 8, further comprising an AND gate coupled to an input of each shift register of said first plurality of shift registers for inhibiting operation of said first plurality of shift registers.

14. The spread-spectrum-matched filter as set forth in claim 8, further comprising an AND gate coupled to an input of each shift register of said second plurality of shift registers for inhibiting operation of said second plurality of shift registers.

15. The spread-spectrum-matched filter as set forth in claim 11, with:

said first reference means including a first plurality of shift registers for storing a first portion of a reference-chip-sequence signal; and said second reference means including a second plurality of shift registers for storing a second portion of the reference-chip-sequence signal.

16. The spread-spectrum-matched filter as set forth in claim 15, with said multiplexer means including a multiplexer coupled to said first plurality of shift registers and to said second plurality of shift registers, responsive to the clock signal, for outputting, from said first plurality of shift registers, through said multiplexer, the first portion of the reference-chip-sequence signal during a first portion of the clock cycle, and for outputting, from said second plurality of shift registers, through said multiplexer, the second portion of the reference-chip-sequence signal during a second portion of the clock cycle.

17. The spread-spectrum-matched filter as set forth in claim 16, with said multiplying means including a plurality of exclusive-OR (XOR) gates, coupled to said data register means and through said multiplexer to said first plurality of shift registers and through said multiplexer to said second plurality of shift registers, responsive to the multiplexer selecting the first plurality of shift registers during the first portion of the clock cycle, for multiplying the first portion of the reference-chip-sequence signal by the plurality of input-data samples during the first portion of the clock cycle, thereby outputting a first plurality of product-output signals, and responsive to said multiplexer selecting the second plurality of shift registers during the second portion of the clock cycle, for multiplying the second portion of the reference-chip-sequence signal by the plurality of input-data samples during the second portion of the clock cycle, thereby outputting a second plurality of product-output signals.

18. A method, for use as part of a spread-spectrum receiver on a received-spread-spectrum signal having a plurality of information bits, with the received-spread-spectrum signal generated from spread-spectrum-processing each information bit with a chip-sequence signal, comprising the steps of:

storing, in a reference-shift register, a plurality of portions of a reference-chip-sequence signal;

generating a clock signal having a clock rate with a clock cycle;

outputting, in response to the clock signal, sequentially, from said reference-shift register, through a multiplexer, each portion of the plurality of portions of the reference-chip-sequence signal during a respective portion of the clock cycle;

shifting, in a data-shift register, a plurality of input-data samples of the received-spread-spectrum signal at the clock rate;

multiplying, in response to selecting during each portion of the clock cycle, the respective portion of the reference-chip-sequence signal by the plurality of input-data samples located in said data-shift register during the respective portion of the clock cycle, thereby outputting a respective plurality of product-output signals;

summing each plurality of product-output signals during the respective portion of the clock cycle, thereby generating a plurality of sums corresponding to the plurality of portions of the reference-chip-sequence signal;

storing, with N an integer, at least N–1 sums of a plurality of N sums; and adding the plurality of N sums.

19. The method as set forth in claim 18, further comprising the steps of inhibiting the clock signal to said reference-shift register.

20. The method as set forth in claim 18, with the step of storing, in said reference-shift register, with said reference-shift register including a first shift register and a second shift register, including the steps of:

storing a first portion of the reference-chip-sequence signal in said first shift register; and storing a second portion of the reference-chip-sequence signal in said second shift register.

21. The method as set forth in claim 20, further comprising the steps of inhibiting the clock signal to said first shift register.

22. The method as set forth n claim 21 with the step of outputting including the steps of:

outputting, from said first shift register and through the multiplexer, the first portion of the reference-chip-sequence signal during a first portion of the clock cycle; and outputting, from said second shift register or and through the multiplexer, the second portion of the reference-chip-sequence signal during a second portion of the clock cycle.

23. The method as set forth in claim 22, with the step of multiplying including the steps of:

multiplying, in response to said multiplexer selecting said first shift register during the first portion of the clock cycle, the first portion of the reference-chip-sequence signal, by the plurality of input-data samples during the first portion of the clock cycle, thereby outputting a first plurality of product-output signals; and multiplying, in response to said multiplexer selecting said second shift register during the second portion of the clock cycle, the second portion of the reference-chip-sequence signal, by the plurality of input-data samples during the second portion of the clock cycle, thereby outputting a second plurality of product-output signals.

24. A method for use as part of a spread-spectrum receiver on a received-spread-spectrum signal having a plurality of information bits, with the received-spread-spectrum signal generated from spread-spectrum processing each information bit with a chip-sequence signal, comprising the steps of:

storing, in a first shift register, a first portion of a reference-chip-sequence signal;

storing, in a second shift register, a second portion of the reference-chip-sequence signal;

generating a clock signal having a clock rate with a clock cycle;

outputting, in response to the clock signal, from said first shift register, through a multiplexer, the first portion of the reference-chip-sequence signal during a first portion of the clock cycle;

outputting, in response to the clock signal, from said second shift register, through the multiplexes, the second portion of the reference-chip-sequence signal during a second portion of the clock cycle;

shifting, through a data-shift register, a plurality of input-data samples of the received-spread-spectrum signal at the clock rate;

multiplying, in response to said multiplexer selecting the first shift register during the first portion of the clock cycle, the first portion of the reference-chip-sequence signal by the plurality of input-data samples located in said data-shift register during the first portion of the clock cycle, thereby outputting a first plurality of product-output signals;

multiplying, in response to said multiplexer selecting the second shift register during the second portion of the clock cycle, the second portion of the reference-chip-sequence signal by the plurality of input-data samples located in said data-shift register during the second portion of the clock cycle, thereby outputting a second plurality of product-output signals;

summing the first plurality of product-output signals during the first portion of the clock cycle, thereby generating a first sum;

summing the second plurality of product-output signals during the second portion of the clock cycle, thereby generating a second sum;

storing the first sum; and adding the first sum to the second sum.

25. The method as set forth in claim 24, further comprising the step of inhibiting the clock signal to any of said first shift register and said second shirt register.

26. A spread-spectrum-matched filter, for use as part of a spread-spectrum receiver on a received-spread-spectrum signal having a plurality of information bits, with the received-spread-spectrum signal generated from spread-spectrum processing each information bit with a chip-sequence signal, comprising:

a reference-shift register for storing a plurality of portions of a reference-chip-sequence signal;

a control processor for generating a clock signal having a clock rate with a clock cycle;

a multiplexer, coupled to said reference-shift register and responsive to the clock signal, for outputting, sequentially, from said reference-shift register and through said multiplexer, each portion of the plurality of portions of the reference-chip-sequence signal during a respective portion of the clock cycle;

a data-shift register, coupled to said spread-spectrum receiver, for shifting a plurality of input-data samples of the received-spread-spectrum signal at the clock rate;

multiplying means, coupled to said data-shift register and through said multiplexer to said reference-shift register, responsive to said multiplexer selecting during each portion of the clock cycle, for multiplying the respective portion of the reference-chip-sequence signal by the plurality of input-data samples located in said data-shift register during the respective portion of the clock cycle, thereby outputting a respective plurality of product-output signals;

an adder tree, coupled to said multiplying means, for summing each plurality of product-output signals during the respective portion of the clock cycle, thereby generating a plurality of sums corresponding to the plurality of portions of the reference-chip-sequence signal;

memory means, coupled to said adder tree, for storing, with N an integer, at least N−1 sums of a plurality of N sums; and an adder, coupled to said adder tree and to said memory means, for adding the plurality of N sums.

27. The spread-spectrum-matched filter as set forth in claim 26, further comprising an AND gate, coupled to said control processor, for inhibiting the clock signal to said reference-shift register.

28. The spread-spectrum-matched filter as set forth in claim 26, with said reference-shift register including:

a first shift register for storing a first portion of a reference-chip-sequence signal; and a second shift register for storing a second portion of the reference-chip-sequence signal.

29. The spread-spectrum-matched filter as set forth in claim 28, further comprising an AND gate, coupled to said reference-shift register, for inhibiting operation of said first shift register.

30. The spread-spectrum-matched filter as set forth in claim 29 with said multiplexer coupled to said first shift register and to said second shift register, responsive to the clock signal, for outputting, from said first shift register and through said multiplexer, the first portion of the reference-chip-sequence signal during a first portion of the clock cycle, and for outputting, from said second shift register and through said multiplexer, the second portion of the reference-chip-sequence signal during a second portion of the clock cycle.

31. The spread-spectrum-matched filter as set forth in claim 30, with said multiplying means including a plurality of exclusive-OR (XOR) gates, coupled to said data-shift register and through said multiplexer to said first shift register and through said multiplexer to said second shift register, responsive to the multiplexer selecting the first shift register during the first portion of the clock cycle, for multiplying the first portion of the reference-chip-sequence signal by the plurality of input-data samples during the first portion of the clock cycle, thereby outputting a first plurality of product-output signals, and responsive to said multiplexer selecting the second shift register during the second portion of the clock cycle, for multiplying the second portion of the reference-chip-sequence signal by the plurality of input-data samples during the second portion of the clock cycle, thereby outputting a second plurality of product-output signals.

* * * * *

UNITED STATES PATENT AND TRADEMARK OFFICE
CERTIFICATE OF CORRECTION

PATENT NO.   :   5,715,276

DATED        :   February 3, 1998

INVENTOR(S)  :   Jimmy Cuong Tran and Sorin Davidovici

It is certified that error appears in the above-identified patent and that said Letters Patent is hereby corrected as shown below:

On the title page item [73],

Delete "West Long Beach, Calif." and insert --West Long Branch, New Jersey--.

Column 20, line 22:   delete "register data" and insert --data register--.

Column 20, line 53:   after "plurality" insert --of--.

Column 28, line 10:   delete "data register" and insert --data-register--.

Column 28, line 34:   delete "or" and insert --for--.

Column 28, line 62:   delete "or" and insert --for--.

Column 29, line 46:   delete "data register" and insert --data-register--.

UNITED STATES PATENT AND TRADEMARK OFFICE
CERTIFICATE OF CORRECTION

PATENT NO.  : 5,715,276
DATED       : February 3, 1998
INVENTOR(S) : Jimmy Cuong Tran and Sorin Davidovici It is certified that error appears in the above-identified patent and that said Letters Patent is hereby corrected as shown below:

Column 30, line 47:  delete "or".

Column 31, line 13:  delete "in response to the clock signals,".

Column 31, line 14:  delete "through the multiplexes,".

Signed and Sealed this

Twenty-first Day of July, 1998

*Attest:*

*Attesting Officer*

BRUCE LEHMAN

*Commissioner of Patents and Trademarks*